US011158369B2

(12) United States Patent
Sharon et al.

(10) Patent No.: US 11,158,369 B2
(45) Date of Patent: Oct. 26, 2021

(54) ON-CHIP NON-VOLATILE MEMORY (NVM) SEARCH

(71) Applicant: Western Digital Technologies, Inc., San Jose, CA (US)

(72) Inventors: Eran Sharon, Rishon Lezion (IL); Alon Marcu, Tel-Mond (IL); Shay Benisty, Beer Sheva (IL); Judah Gamliel Hahn, Ofra (IL); Idan Alrod, Herzeliya (IL); Alexander Bazarsky, Holon (IL); Ariel Navon, Revava (IL); Ran Zamir, Ramat Gan (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 82 days.

(21) Appl. No.: 16/232,639

(22) Filed: Dec. 26, 2018

(65) Prior Publication Data
US 2020/0211640 A1 Jul. 2, 2020

(51) Int. Cl.
*G11C 11/56* (2006.01)
*H03K 19/21* (2006.01)
(Continued)

(52) U.S. Cl.
CPC ........ *G11C 11/5628* (2013.01); *G06F 9/3004* (2013.01); *G11C 8/16* (2013.01);
(Continued)

(58) Field of Classification Search
None
See application file for complete search history.

(56) References Cited

U.S. PATENT DOCUMENTS 8,780,634 B2  7/2014  Li et al.
9,436,402 B1  9/2016  De Santis et al.
(Continued)

FOREIGN PATENT DOCUMENTS

KR  20140052691 A  5/2014

OTHER PUBLICATIONS

Gu et al, "Biscuit: A Framework for Near-Data Processing of Big Data Workloads"; 2016 ACM/IEEE 43rd Annual Intl Symposium on Computer Architecture (ISCA); Jun. 2016; DOI: 10.1109/ISCA. 2016.23; isca2016.eecs.umich.edu/wp-content/uploads/2016/07/3A-1.pdf; 37 pages.
(Continued)

*Primary Examiner* — Charles Rones
*Assistant Examiner* — Jonah C Krieger
(74) *Attorney, Agent, or Firm* — Loza & Loza, LLP; Gabriel Fitch

(57) ABSTRACT

The disclosure relates in some aspects to on-chip processing circuitry formed within the die of a non-volatile (NVM) array to perform data searches. In some aspects, the die includes components configured to sense wordlines of stored data in the NVM array by applying voltages on the wordlines serially, and then search for an input data pattern within the serially-sensed wordlines. In some examples, the components of the die include latches and circuits configured to perform bitwise latch logic search operations. In other examples, the search components are configured with under-the-array or next-to-the-array dedicated search circuitry that uses registers and/or random access memory (RAM). Other aspects relate to a separate controller device for controlling the on-chip NVM search operations. For example, the controller may determine whether to search for data using search components of the NVM die or processors of the controller based, e.g., on a degree of fragmentation of data.

22 Claims, 17 Drawing Sheets

(51) Int. Cl.
*G06F 9/30* (2018.01)
*G11C 8/16* (2006.01)
*G11C 11/065* (2006.01)
*H03K 19/1776* (2020.01)

(52) U.S. Cl.
CPC ........ *G11C 11/065* (2013.01); *H03K 19/1776* (2013.01); *H03K 19/21* (2013.01)

(56) References Cited

U.S. PATENT DOCUMENTS

| | | | |
|---|---|---|---|
| 9,875,799 B1* | 1/2018 | De Santis | H01L 27/00 |
| 2008/0080603 A1* | 4/2008 | Bunce | G06F 16/90344 |
| | | | 375/224 |
| 2009/0034396 A1* | 2/2009 | Bates | G11B 7/24044 |
| | | | 369/103 |
| 2009/0190404 A1 | 7/2009 | Roohparvar | |
| 2014/0119124 A1* | 5/2014 | Kim | G11C 16/3422 |
| | | | 365/185.18 |
| 2014/0133233 A1* | 5/2014 | Li | G11C 15/046 |
| | | | 365/185.11 |
| 2014/0229131 A1* | 8/2014 | Cohen | G11C 29/021 |
| | | | 702/64 |
| 2016/0118112 A1* | 4/2016 | Liang | G11C 11/5642 |
| | | | 714/48 |
| 2017/0091024 A1* | 3/2017 | Bandic | G06F 11/1068 |
| 2018/0053562 A1* | 2/2018 | Reusswig | G11C 16/3427 |
| 2019/0340281 A1* | 11/2019 | Maiti | G06F 9/45558 |

OTHER PUBLICATIONS

International Search Report and Written Opinion for International Application No. PCT/US2019/050106, dated Sep. 3, 2020, 14 pages.

* cited by examiner

SEARCH PATTERN MODIFICATION BASED ON SIZE/ COMPLEXITY OF THE SEARCH PATTERN ⟋ 600

602

SSD CONTROLLER ANALYZES AN INPUT SEARCH PATTERN RECEIVED FROM A HOST DEVICE TO DETERMINE ITS SIZE AND/OR COMPLEXITY BASED, FOR EXAMPLE, ON A COMPARISON OF THE PATTERN WITH VARIOUS SIZE AND/OR COMPLEXITY THRESHOLDS

604

IF INPUT SEARCH PATTERN IS TOO LARGE AND/OR COMPLEX, THE SSD CONTROLLER SUBDIVIDES THE PATTERN INTO SMALLER AND/OR LESS COMPLEX PATTERNS

606

SSD CONTROLLER SELECTIVELY SUBMITS ONE OR MORE OF THE SUBDIVIDED PATTERNS TO THE NVM DIE FOR SEARCHING WITHIN THE STORED NVM DATA USING ON-CHIP SEARCH CIRCUITRY WHILE, IN SOME EXAMPLES, SEARCH FOR OTHER SUBDIVIDED PATTERNS USING THE PROCESSOR OF THE CONTROLLER (BASED ON DATA SENSED FROM THE NVM DIE)

*FIG. 6*

LATCH LOGIC SEARCH PROCEDURES PERFORMED BY CIRCUITRY OF AN NVM DIE — 800

802
PERFORM A SERIES OF ITERATIVE SERIAL SENSING OPERATIONS WITHIN THE NVM ARRAY (E.G. WORDLINE AFTER WORDLINE FOR ALL WORDLINES IN A BLOCK/PLANE) TO SENSE DATA AND, FOR EACH ITERATIVE OPERATION, LATCH THE SENSED DATA IN A FIRST LATCH

804
FOR EACH ITERATIVE OPERATION, PERFORM A BITWISE LOGIC OPERATION ON THE SENSED DATA USING A SECOND LATCH TO COMPARE THE SENSED DATA TO AN INPUT SEARCH PATTERN BY, E.G., "AND"-ING THE SENSED DATA THAT RESIDES IN THE FIRST LATCH WITH A MASK PAGE LOCATED IN A SECOND LATCH HAVING 1'S IN A SPECIFIED SEARCH FIELD AND 0'S ELSEWHERE, AND STORE THE RESULT IN A THIRD LATCH

806
FOR EACH ITERATIVE OPERATION, XOR THE RESULT STORED IN THE THIRD LATCH WITH A FOURTH LATCH CONTAINING A SEARCH PATTERN (E.G. THE PATTERN TO BE SEARCHED FOR AS RECEIVED FROM THE SSD CONTROLLER) AND STORE THE RESULTING XOR PAGE IN A FIFTH LATCH (OR STORE IN PLACE IN THE FOURTH LATCH)

808
FOR EACH ITERATIVE OPERATION, COUNT THE NUMBER OF 1'S IN THE RESULTING XOR PAGE TO DETECT A MATCH BETWEEN THE SENSED DATA AND THE SEARCH PATTERN, AND, IF A MATCH IS FOUND (BASED, E.G. ON COMPARING THE COUNT OF MISMATCHED BITS AGAINST A MATCH THRESHOLD WHILE TAKING INTO ACCOUNT A NUMBER OF ALLOWED FLIPPED BITS AS REPRESENTED, E.G., BY A PERCENTAGE OF THE SIZE OF THE SEARCH PATTERN), TRANSFER THE DATA TO THE SSD CONTROLLER OR, IF NO MATCH IS FOUND AFTER COMPLETION OF ALL ITERATIONS, SEND A SIGNAL TO THE SSD CONTROLLER TO INDICATE THE SEARCH PATTERN WAS NOT FOUND WITHIN THE BLOCKS/PLANES SEARCHED

*FIG. 8*

RAM-BASED/REGISTER-BASED SEARCH PROCEDURES PERFORMED BY UNDER-THE-ARRAY OR NEXT-TO-THE ARRAY NVM DEDICATED SEARCH CIRCUITRY ⟵ 1100

1102
PERFORM A SERIES OF SERIAL SENSING OPERATIONS WITHIN THE NVM ARRAY (E.G. WORDLINE AFTER WORDLINE FOR ALL WORDLINES IN A BLOCK/PLANE) TO SENSE DATA AND STORE THE SENSED DATA IN RAM OR IN MEMORY REGISTERS

1104
SEARCH THE SENSED DATA TO DETECT POSSIBLE MATCHES TO AN INPUT SEARCH PATTERN BY, FOR EXAMPLE, SERIALLY SCANNING ALL WORDLINES OF A BLOCK OF SENSED DATA TO SEPARATELY STORE A PLURALITY OF CANDIDATE MATCHING WORDLINES

1106
PERFORM LOGIC PROCESSING OF THE POSSIBLE MATCHES (E.G. THE CANDIDATE MATCHING WORDLINES) TO IDENTIFY A FULLY-MATCHED WORDLINE WITHIN POSSIBLY UNSTRUCTURED DATA

1108
SEND ONLY THE FULLY-MATCHED WORDLINE TO THE SSD CONTROLLER (OR SEND ALL POTENTIALLY-MATCHING CANDIDATE WORDLINES TO THE SSD CONTROLLER, IF A FULL MATCH IS NOT FOUND, FOR FURTHER PROCESSING IN THE SSD CONTROLLER)

*FIG. 11*

ON-CHIP NON-VOLATILE MEMORY (NVM) SEARCH

FIELD

The disclosure relates, in some embodiments, to data storage devices and apparatus, such as solid state devices that employ non-volatile memory arrays formed within integrated circuit dies. More specifically, but not exclusively, the disclosure relates to implementing data search functions within the die of a non-volatile memory array.

INTRODUCTION

Data storage devices and apparatus include solid state devices (referred to herein as SSDs) such as solid state drives. Such devices may incorporate non-volatile memory (NVM) arrays. Examples include NAND flash drives. Such devices are replacing or supplementing rotating hard disk drives for mass storage in many consumer or industrial electronics and computers. In a typical SSD-based product, a host computing device includes or communicates with a memory controller of the SSD that in turn controls access to one or more NVM arrays (e.g. NAND arrays) of the SSD. Data is stored within the NVM array at physical block addresses (PBAs). The host may maintain a table of connections between data and a corresponding logical block address (LBA) for the data. For a read command from the NVM array of an SSD, data is requested by the host by supplying the LBA for the information to the SSD. The SSD controller may then use an LBA-PBA table (maintained within the SSD) to translate the LBA to the corresponding PBA for routing to the NVM. The NVM returns data to the host via SSD controller that corresponds to the PBA.

If the host needs to search for certain data within a range of LBAs (as often occurs, e.g., with media data), the host will often fetch all of the data from the NVM that corresponds to the LBA range so the host can then search for the particular data it needs within the returned data. This may involve considerable unnecessary effort, since much of the data acquired by the host from the NVM within the LBA range will be discarded by the host, as only the relevant data that matches a particular search criterion may be needed by the host.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an apparatus that includes an NVM array formed in a die and a processing circuit also formed in the die. In one example, the processing circuit formed in the die is configured to: receive an identifier of information to search for within the NVM array; sense wordlines of stored data in the NVM array by applying voltages on the wordlines serially; and search for the information within the serially-sensed wordlines of data.

Another embodiment of the disclosure provides a method for use by an NVM die. The method includes: inputting a search pattern identifying information to search for within an NVM array of the NVM die; searching for the information within the NVM array of the NVM die based on the search pattern using on-chip search circuitry that senses wordlines of stored data in the NVM array by applying voltages on the wordlines serially and then scans serially-sensed wordline data to find information matching the search pattern; and outputting an indication of a result of the search from the NVM die.

Still another embodiment of the disclosure provides an apparatus that includes: an input component configured to input a search command from a host identifying information to search for within stored data on an NVM die coupled to the apparatus; and a processor configured to determine whether to search for the information using on-chip search circuitry within the NVM die or using a search component of the apparatus based on one or more of a characteristic of the input search command and a structure of the stored data, and to then, in response to a determination to search using the on-chip search circuitry within the NVM die, control the NVM die to search for the information using the on-chip data search circuitry of the NVM die and receive search results from the NVM die, or, in response to a determination to search using a search component of the apparatus, read one or more blocks of data from the NVM die and search for the information within the one or more blocks read from the NVM die using the search component of the apparatus.

Another embodiment of the disclosure provides a method for use with an NVM die. The method includes: receiving a search command identifying information to search for within the NVM die; determining one or more of a characteristic of the input search command and a characteristic of data stored within the NVM die; determining whether to search for the information using on-chip search circuitry within the NVM die or using a processor of a controller based on the determined characteristic; in response to a determination to search using the on-chip search circuitry, controlling the NVM die to search for the information using the on-chip search circuitry of the NVM die; and, in response to a determination to search using the processor of the controller, reading one or more blocks of data from the NVM die and searching for the information within the one or more blocks read from the NVM array using the processor.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 6 illustrates an example of search pattern modification operations for use by a controller of an NVM die configured with on-chip search circuitry.

FIG. 8 illustrates an example of latch logic search operations for use by an NVM die configured with on-chip latch logic search circuitry.

FIG. 10 illustrates exemplary latches and wordlines for use with latch logic wherein two or more tokens are searched for.

FIG. 11 illustrates an example of random access memory (RAM)/register-based search operations for use by an NVM die configured with on-chip search circuitry.

DETAILED DESCRIPTION

Figure 1:
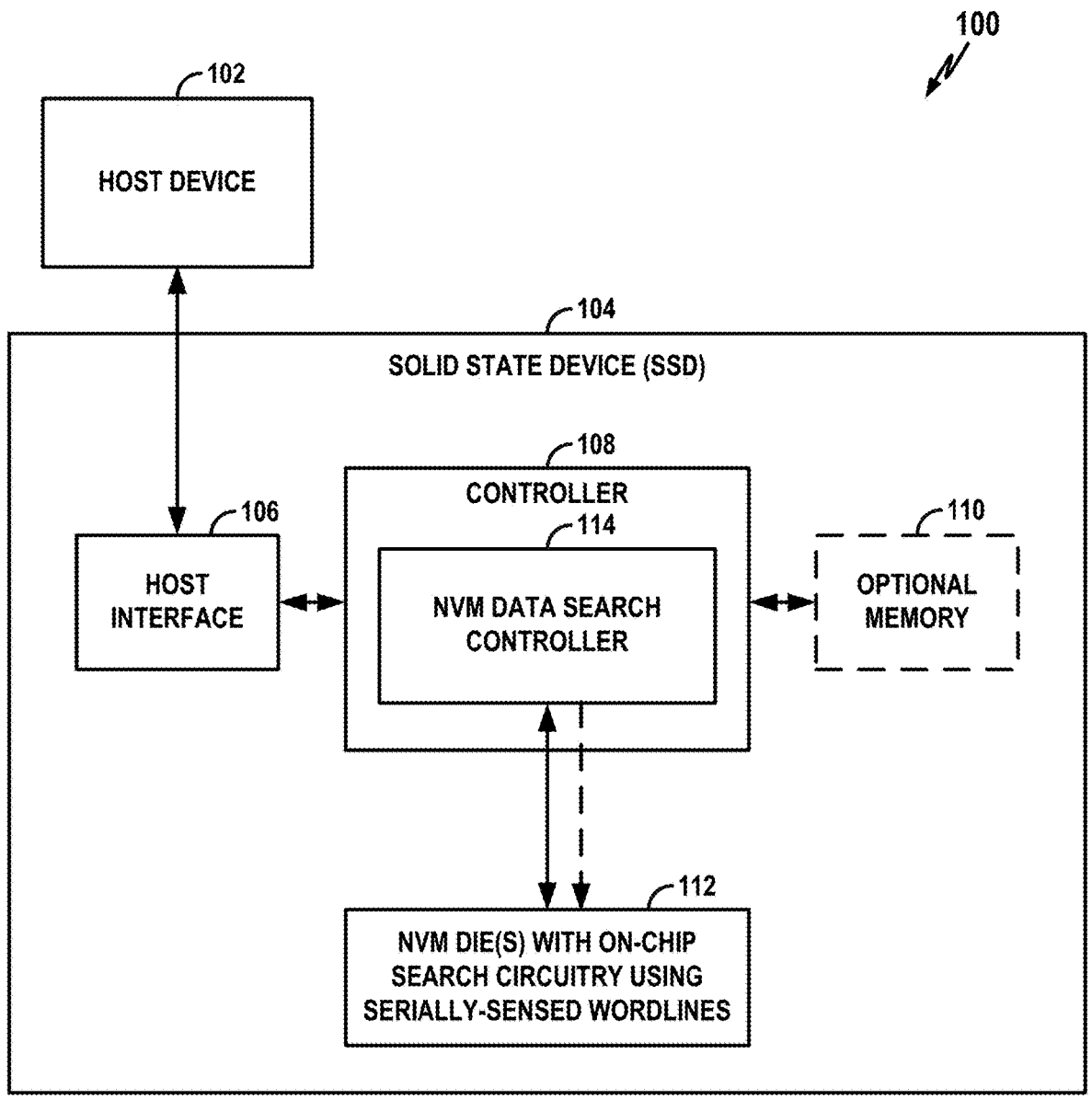
FIG. 1 illustrates an example of a memory system including a data storage device (e.g., an SSD) configured in accordance with one or more aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays, and to data storage devices or apparatus for controlling the NVM arrays, such as a controller of a data storage device (such as an SSD), and in particular to NAND flash memory storage devices (herein "NANDs"). (A NAND is a type of non-volatile storage technology that does not require power to retain data. It exploits negative-AND, i.e. NAND, logic.) For the sake of brevity, an SSD having one or more NAND dies will be used below in the description of various embodiments. As used herein, the term die may refer to a set of NVM cells, and the associated circuitry for managing the physical operation of the NVM cells (including sensing data in the NVM cells), that are formed on a single semiconductor substrate. It is understood that at least some aspects described herein may be applicable to other forms of data storage devices as well. For example, at least some aspects described herein may be applicable to phase-change memory (PCM) arrays, magneto-resistive random access memory (MRAM) arrays and resistive random access memory (ReRAM) arrays.

As noted above, if a host device needs to search for certain data stored on an NVM array (such as particular data within a range of LBAs), the host will often fetch all of the data from the NVM array that corresponds to the LBA range so the host can then search for the particular data it needs within the returned data. This may involve a great amount of unnecessary effort, as much of the data acquired from the NVM array within the LBA range will be discarded by the host, since only the relevant data that matches a particular search criterion may be needed by the host. For example, if a host needs to search for a certain fragment of a media file within an LBA range, the host will read the entire LBA range from the NVM array by having the controller of the NVM array fetch all of the corresponding data. The host then compares the fetched data to the search fragment and only information relating to the search fragment is then kept by the host, while the rest is discarded. Thus, a NAND flash NVM die may be required to perform numerous sense operations, transfer the sensed data to the controller (which decodes the data), all before the host receives the data for processing by its software, which can result in inefficient processing and slow overall processing times. Such procedures may also decrease the endurance of the NVM dies since many read cycles are issued to sense and transfer data that is discarded by the host. Moreover, a very large index table (such as a flash translation layer (FTL) table) may need to be maintained and updated by the controller to accommodate the many reads from the NVM array.

Herein, methods and apparatus are disclosed for configuring and using processing circuitry within the die of an NVM array of an SSD to perform search operations so that only data found in the search is then sent to a host device. In some aspects of the disclosure, the die of the NVM array includes processing components configured to: receive an identifier of information to search for within the NVM array; sense wordlines of stored data in the NVM array by applying voltages on the wordlines serially; search for the information within the serially-sensed wordlines; and output an indication of a result of the search. In some examples, the processing circuit of the die includes various latches and search circuits configured to perform bitwise latch logic search operations to search for the data. In other examples, the processing circuit is configured with under-the-array or next-to-the-array dedicated search circuitry to search for the information using registers and/or random access memory (RAM) components. For instance, the under-the-array dedicated search circuitry may be configured to: store data deemed to match an input search pattern in the registers or the RAM, scan over all wordlines of a NAND block of sensed data to store a plurality of matching wordlines, perform additional logic processing on the plurality of matching wordlines to identify fully-matched wordlines, and then output only the fully matched wordlines from the die (via a controller to the host device). Note that dedicated search circuitry is logic formed on or in the memory die, which can be placed under the memory array (to save die area) or next to it. This is as opposed to using existing latches and logic (i.e. non dedicated search logic), which exists for supporting the regular memory operations, such as read and write.

Note that, in various examples described herein, data or information to be searched for in the NVM array is read by sensing wordlines in the NVM array by applying voltages on the wordlines serially, rather than in parallel. A search is then performed within the serially-sensed wordlines of data. This is in contrast to content-addressable memory (CAM) devices that may instead need to sense data in parallel using modified versions of NAND memory arrays. One advantage of at least some of the systems and procedures described herein is that no significant changes need to be made to otherwise conventional NAND memory arrays, other than providing any appropriate under-the-array or next-to-the-array dedicated search circuitry. For example, latch logic-based search circuits and procedures are described herein that involve minimal changes to otherwise standard flash NAND memory dies.

Methods and apparatus are also disclosed herein for configuring and using a controller (e.g. an SSD controller) to control an NVM die to perform search operations. In some aspects of the disclosure, the controller receives a search command identifying data/information to search for within an NVM array. The controller then determines whether the data to search for is fragmented over multiple storage blocks in the NVM die. If fragmented, the controller reads the blocks from the NVM die and searches for the information in the blocks read from the NVM die. If not fragmented, the controller forwards the search command to the NVM die for processing using on-chip (or "in-memory") data search circuitry of the NVM die (such as the aforementioned bitwise latch logic circuitry or the under-the-array (or next-to-the array) dedicated search circuitry that uses register-and/or RAM-based components). In some examples, the controller is configured to determine the degree of fragmentation based on, for example, a measure of sequentiality of the searched data. In embodiments where the NVM die includes both bitwise latch logic circuitry and under-the-array (or next-to-the-array) RAM search circuitry, the controller may be configured to control the on-chip data search circuitry of the NVM die to use either its latch-based circuitry or its under-the-array/next-to-the-array circuitry to search for the information based on the degree of fragmentation of the data (as indicated, e.g., by the complexity of the search criteria or the structure of the data). In one example, if the search criteria are complex, an under-the-array/next-to-the-array dedicated search circuitry-based search may be preferred. In another example, if the structure of the data shows that data pages are aligned with the NAND pages and the search is aimed at finding pages having a specific value in a specific field, then a bitwise latch-based search may instead be preferred.

For the purposes of illustration, various aspects of the disclosure will be described in the context of a memory system that includes NAND memory technology. A NAND device may be referred to herein as a NAND Flash memory, a NAND memory device, a NAND flash, or a NAND. Generally speaking, a NAND device is an NVM having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., to NVMs other than NAND devices).

Example On-Chip-Based NVM Data Search Systems and Methods

FIG. 1 illustrates an embodiment of a memory system 100 that includes a host device 102 and an SSD 104 communicatively coupled to the host device 102. The host device (e.g., a host computer) 102 provides commands to the SSD 104 for transferring data between the host device 102 and the SSD 104. For example, the host device 102 may provide a write command to the SSD 104 for writing data to the SSD 104 or a read command to the SSD 104 for reading data from the SSD 104. The host device 102 may be any system or device with a compatible interface for communicating with the SSD 104. For example, the host device 102 may a computing device, a personal computer, a portable computer, or workstation, a server, a personal digital assistant, a digital camera, a digital phone, or the like.

The SSD 104 includes a host interface 106, a controller 108, a volatile (optional) memory 110, and one or more NVM dies 112 each provided with on-chip (or in-memory) search circuitry that search, e.g., using serially-sensed wordlines. The host interface 106 is coupled to the controller 108 and facilitates communication between the host device 102 and the controller 108. Additionally, the controller 108 is coupled to the volatile memory 110 and the NVM die 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, peripheral component interface express (PCIe) interface, or the like. In some examples, the host interface 106 exploits PCIe-NVMe (where NVMe refers to NVM Express). In some embodiments, the host device 102 includes the SSD 104 (e.g., the host device 102 and the SSD 104 are implemented as a single component). In other embodiments, the SSD 104 is remote with respect to the host device 102 or is contained in a remote computing system coupled in communication with the host device 102. For example, the host device 102 may communicate with the SSD 104 through a wireless communication link.

The controller 108 controls operation of the SSD 104. The controller 108 may receive commands from the host device 102 through the host interface 106 and perform the commands to transfer data between the host device 102 and the NVM die(s) 112. In addition, the controller 108 may perform internal operations such as garbage collection operations, data integrity operations, and wear leveling operations. The controller 108 may include any type of processing device, such as a microprocessor, microcontroller, embedded controller, a logic circuit, software, firmware, or the like, for controlling operation of the SSD 104.

In some embodiments, some or all of the functions described herein as being performed by the controller 108 may instead be performed by another element of the SSD 104. For example, the SSD 104 may include a separate microprocessor or other processing device for performing one or more of the functions described herein as being performed by the controller 108. In some embodiments, one or more of the functions described herein as being performed by the controller 108 are instead performed by the host device 102. In some embodiments, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a RAM or other volatile memory, such as a dynamic RAM (DRAM), a static RAM (SRAM), a synchronous DRAM (SDRAM), a flash storage, an erasable programmable read-only-memory (EPROM), an electrically erasable programmable ROM (EEPROM), or the like. In various embodiments, the controller 108 uses the memory 110, or a portion thereof, to store data during the transfer of data between the host device 102 and the NVM die 112. For example, the memory 110 or a portion of the memory 110 may be a cache memory.

The controller 108 includes an NVM data search controller 114 configured, e.g., for controlling the NVM die(s) 112 to perform an on-chip data search. For example, the controller 108 may send a search command received from the host device 102 to one of the NVM dies 112 to instruct the die to perform a search of data stored in its NVM arrays using its on-chip search circuitry to find a particular string of data within an LBA range and then return only the information (rather than all of the data within the LBA range). In some examples, such as if the information is fragmented, the search controller 114 may instead choose to perform the search itself by instructing the NVM die to return all data within the LBA range, which the search controller 114 then analyzes to find the requested data. In still other examples, such as if the host device 102 specifically instructs the SSD 104 to return all data in an LBA range, the controller 108 instead relays all of the data within the LBA range to the host for processing by host software.

One advantage of an on-chip (or in-memory) die search is that only the data pages that meet the search criteria are transferred from the memory die to the memory controller over the intervening bus (e.g. a toggle mode bus). This can provide, e.g., reduced power consumption and reduced bus bandwidth, which allows parallel search on a large number of memory dies sharing the same bus, each transferring only data pages matching the search criteria.

Although FIG. 1 shows an example SSD and an SSD is generally used as an illustrative example in the description throughout, the various disclosed embodiments are not necessarily limited to an SSD application/implementation. As an example, the disclosed NVM die and associated processing components can be implemented as part of a package that includes other processing circuitry and/or components. For example, a processor may include, or otherwise be coupled with, embedded NVM and associated circuitry and/or components for deep learning that are described herein. The processor could, as one example, off-load certain deep learning tasks to the NVM and associated circuitry and/or components. As another example, the controller 108 may be a controller in another type of device and still include the neural network controller 116 and perform some or all of the functions described herein.

Figure 2:
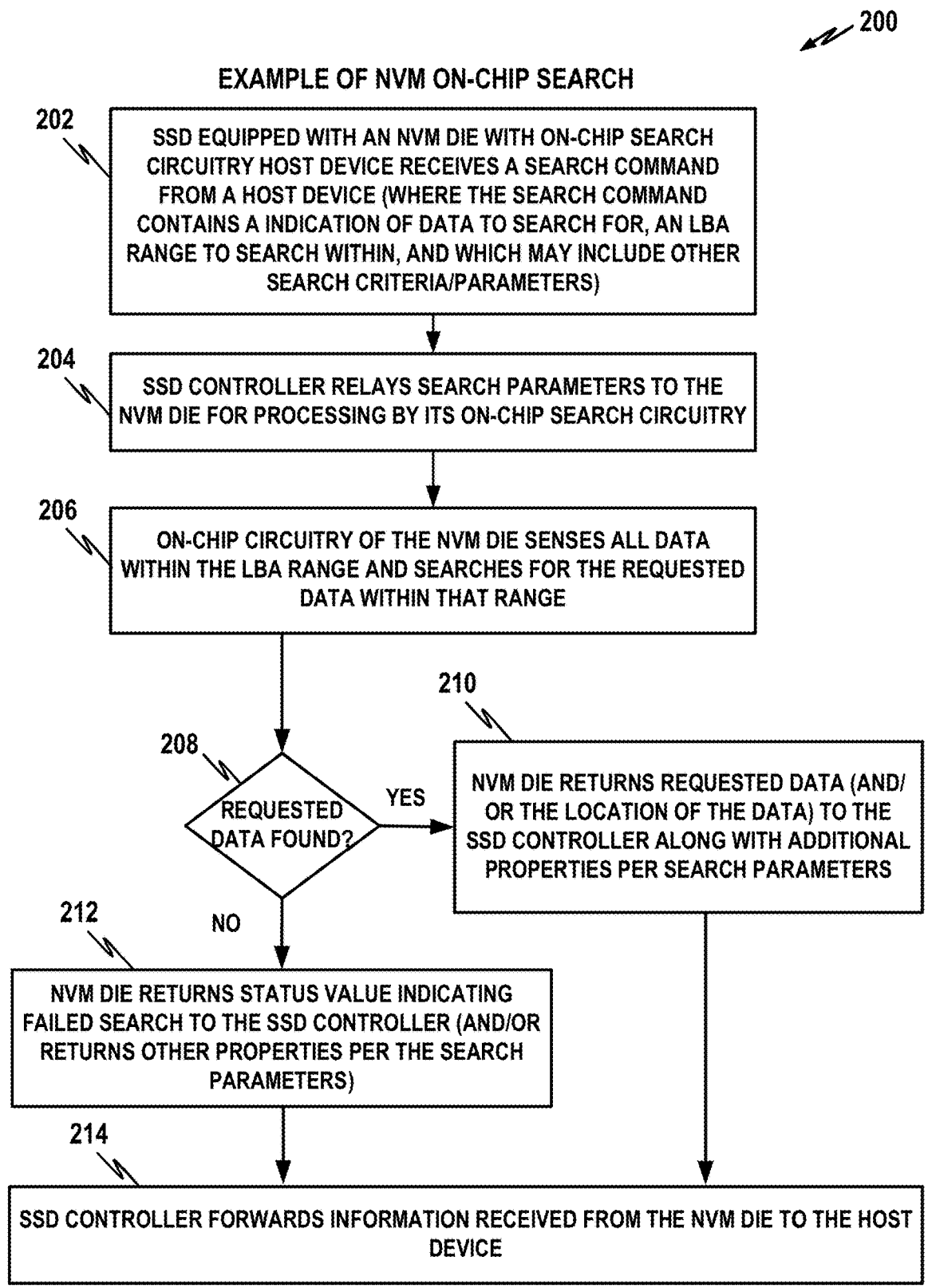
FIG. 2 illustrates an example of operations for use by an apparatus having a controller and an NVM die configured with on-chip (or in-memory) search circuitry.

FIG. 2 summarizes exemplary data search operations 200 that may be performed in accordance with the teachings herein, where a data search is performed by on-chip components of an NVM die. The operations 200 may take place within a system (such as the one of FIG. 1) having a host device and an SSD having a controller and an NVM die equipped with on-chip data search circuitry (or by other suitable devices or apparatus). At block 202, the SSD receives a search command from a host device where the search command contains an indication of data to search for (such as a fragment or piece of information or a data pattern), an LBA range to search within (which may be an optional parameter), and which may further include other search parameters, such as additional search criteria. The additional search criteria may specify, for example, whether the host device wants to receive the actual data, if found, or just the location (e.g. the address) of the found data within the NVM array (or perhaps just an indication that the data has been found). In some examples, the additional data may specify a number of allowed flipped bits (which, as will be explained below, can be taken into account in some examples during the search). The search command, in some examples, may be in the form of an NVMe command extension and if, so, modifications may be provided to the host to accommodate the NVMe extension. (Otherwise, the search operations described herein might be transparent to the host, in at least some embodiments.) In some examples, the search pattern may specify a particular pattern of pixels in an image to search for within a media file stored on the NVM die, such as within a video or a photo.

At block 204, the SSD controller relays the search parameters to the NVM die for processing as a search function by its on-chip search circuitry. At block 206, the on-chip circuitry of the NVM die senses all data within the LBA range (or within all stored data, if no range is provided) and searches for the information within the sensed data by, e.g., comparing a fragment of information to all information in the sensed data. That is, in some examples, the NVM die applies the search function to all information in the LBA range. If, following decision block 208, the information (or portions thereof) is found, then, at block 210, the NVM die returns the information (and/or the location of the found data) to the SSD controller along with any additional properties specified by the search parameters (such as, e.g., a measure of the fragmentation of the searched data). If, following decision block 208, the information is not found by the NVM die, then, at block 214, the NVM die instead returns a status value indicating a failed search to the SSD controller (and/or returns other properties per the search parameters, such as some indication of why the search failed).

At block 214, the SSD controller forwards the information received from the NVM die to the host device (such as the found data or an indication that the information was not found). Additionally or alternatively, at block 214, the SSD controller returns "metadata," e.g. a search index and other search result properties requested by the host device. For example, an "anchor point" may be denoted as the location of a first byte of a matched pattern. The host device may request (as part of its search command) that the SSD controller return data from the NVM starting from an offset −x bytes before the anchor point and ending with +y bytes after the anchor point. Similarly, the host device may request that the SSD controller return a list of data fragments per match, each having its own (x, y) pair. As can be appreciated, a wide range of information can be returned from the NVM die to the SSD controller and from the SSD controller to the host device. Multiple NVM dies may be searched. It is noted that these NVM-based search techniques do not require the data to be structured in any particular way. Moreover, it should be understood that the SSD controller may receive search commands from the host device in one format (such as in the format of a modified NVMe command) and then relay portions of those search commands to the NVM die in another format (such as via modified ONFi signals).

Figure 3:
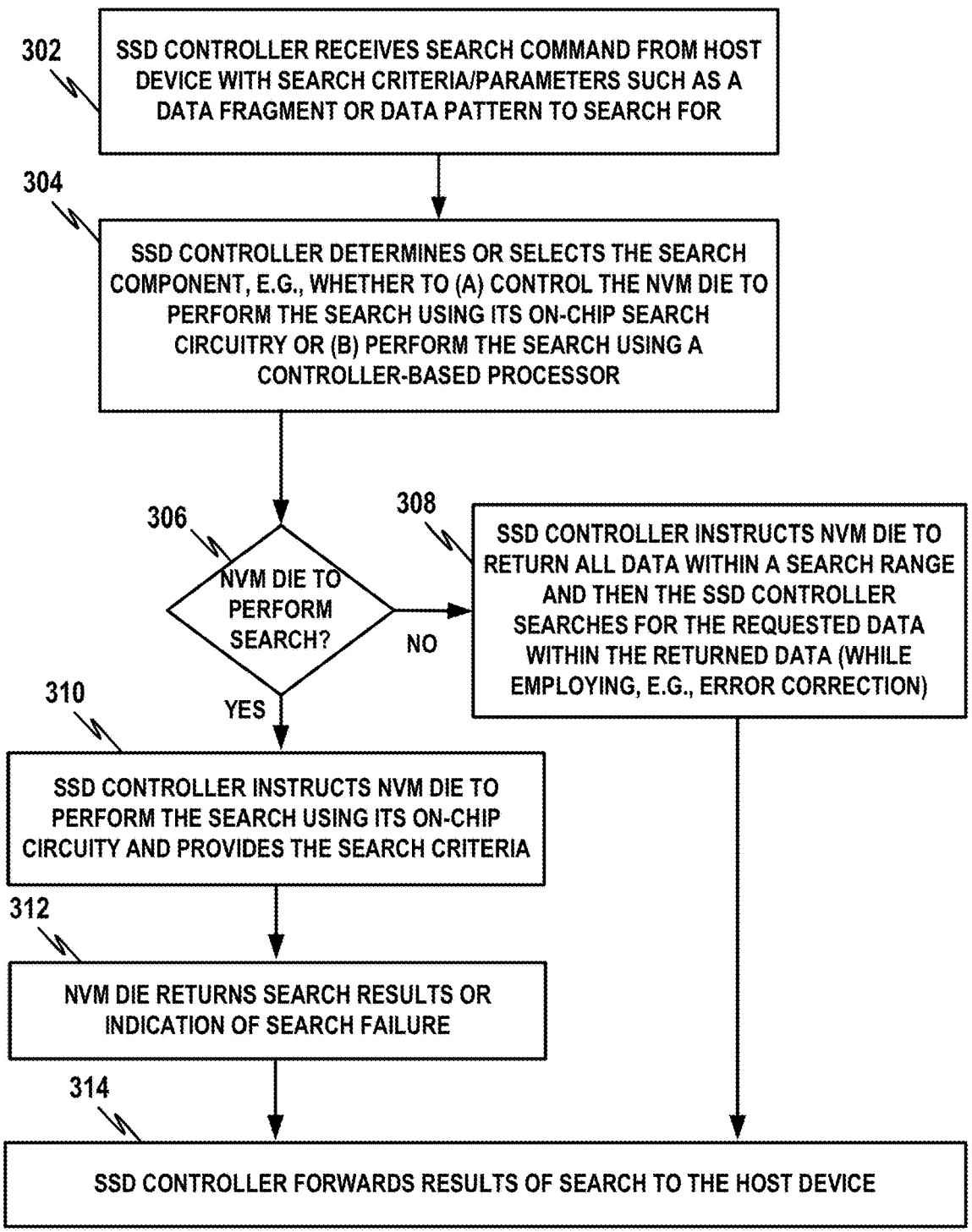
FIG. 3 illustrates another example of operations for use by an apparatus having a controller and an NVM die configured with on-chip search circuitry.

FIG. 3 summarizes other exemplary data search operations 300 that may be performed in accordance with the teachings herein, where a data search is selectively performed either by on-chip components of an NVM die or by the SSD controller. The operations 300 may again take place within a system (such as that of FIG. 1) having a host device and an SSD having a controller and an NVM die equipped with on-chip data search circuitry (or by other suitable devices or apparatus). In this embodiment, the controller may decide whether to use an NVM-based search function or apply a controller-based search function. An on-chip NVM-based search offers advantages when the search data resides in the same wordlines or the same blocks, so that one command to the NVM die may cover a large search area. However, when the search data is not arranged in the same wordlines or blocks, but is instead fragmented, a controller-based search may offer latency improvements.

At block 302 of FIG. 3, the SSD controller receives a search command from the host device where the search command includes search criteria/parameters (such as a data fragment or pattern to search for, e.g. "requested data"). At block 304, the SSD controller determines the search component to use, that is, the SSD controller chooses whether to (a) control the NVM die to perform the search using its on-chip search circuitry or (b) perform the search itself using a controller-based processor, with the determination made based on various factors described below. (In some examples, the controller may choose to use a combination of controller-based and NVM-based searching. For example, the controller can subdivide a large input search pattern into a number of smaller search patterns and then search for some of those smaller patterns using the on-chip search of the NVM die while searching for other patterns using a controller-based search.)

If, following decision block 306, the SSD controller has determined it will perform the search itself, then, at block 308, the SSD controller instructs the NVM die to return all data within a search range (such as within an LBA range specified by the search command received form the host device), and the SSD controller searches for the information within the returned data based on the search criteria. For a controller-based search, the wordlines within a search range may be transferred from NVM die to the SSD controller, with the search then performed by a processor of the controller. This can save the transferring of the data to the host device (in case the data does not match the search criteria). Error correction may be performed, at block 308, by the SSD controller on the returned data so a more accurate match may be detected between the information to search for and the strings of data sensed by the NVM die and returned to the SSD controller. The error correction may employ error correction codes (ECCs). Note that in many SSDs error correction is performed only by the SSD controller and not by the NVM die(s) and so, in such devices, error correction is not available for NVM-based searches via on-chip search circuitry.

If, following decision block 306, the SSD controller has determined that the NVM die should instead perform the search, then, at block 310, the SSD controller instructs NVM die to perform the search using its on-chip circuitry and provides the search criteria. As will be explained, in some examples, the SSD controller may instruct the NVM die to perform the search using particular components within the NVM die, such as by using latch-based bitwise logic or instead using under-the-array or next-to-the-array dedicated search logic. At block 312, the NVM die returns the search results or an indication of search failure (or other suitable information per the search request). At block 314, the SSD controller forwards the results of the search to the host device (e.g. the controller forwards information received from the NVM die, if the NVM die performed the search, or the controller forwards the results of its own search). The particular information returned to the host may depend on the search parameters originally provided by the host device. As noted above, various types of metadata may be returned to the host device, along with the information (or instead of the requested data), depending upon the search request parameters provided by the host device. Moreover, as noted, in some examples a combination of an NVM-based search and a controller-based search may be performed, with a portion of a host search request serviced by an on-chip NVM search and another portion of the search request serviced by the SSD controller based on information received from the NVM die.

Figure 4:
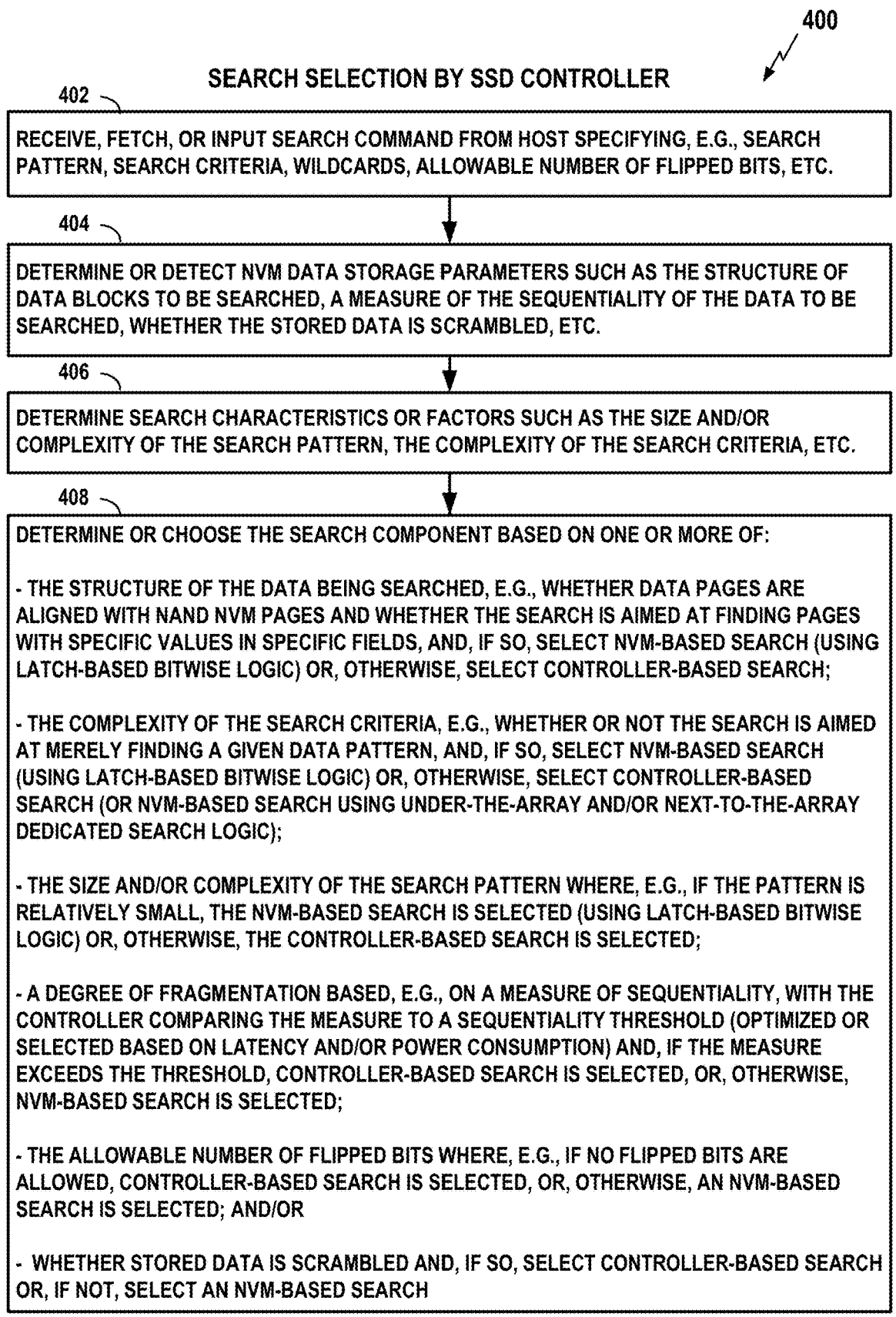
FIG. 4 illustrates an example of search selection operations for use by a controller of an NVM die configured with on-chip search circuitry.

FIG. 4 summarizes operations 400 and criteria for use by the SSD controller (or other suitable device) for determining whether the NVM die should perform all (or a portion) of the search or whether an NVM-based search should be initiated to perform all (or a portion) of the search (for use, e.g., at block 304 of FIG. 3). At block 402, the SSD controller receives, fetches, or inputs a search command from a host device specifying various parameters, such as a search pattern, search criteria, wildcards, allowed number of flipped bits, etc. At block 404, the SSD controller determines or detects NVM data storage parameters such as the structure of data blocks to be searched within the NVM die, a measure of the sequentiality of the data to be searched, whether the stored data is scrambled, etc. The sequentiality (where the term may be defined as the "condition of being sequential" or "characterized by a regular sequence of portions") may be determined, for example, based on information in FTL tables maintained by the SSD controller. At block 406, the SSD controller determines various search characteristics or search factors such as the size and/or complexity of the search pattern, the complexity of the search criteria, etc. This may be performed by analyzing the search parameters received from the host in comparison with various predetermined thresholds set to distinguish complex from simple or large from small.

At block 408, the SSD controller determines or chooses the search component to use based on one of more of:

The structure of the data being searched, e.g., whether data pages are aligned with NAND pages (for a NAND NVM implementation) and whether the search is aimed at finding pages having a specific value in a specific field, and, if so, then an NVM-based search may be selected (and, in particular, an NVM-based search using latch-based bitwise logic, to be described below) or, otherwise, if the data pages are not aligned with the NAND pages, then an SSD controller-based search may be selected;

The complexity of the search criteria, e.g., whether the search is aimed at merely finding a given data pattern (potentially with wildcards, discussed below), then an NVM-based search may be selected (and, in particular, a search using latch-based bitwise logic) or, otherwise, if the search criteria is more complex (such as a value in field 1+the value in field 2>5 times the value in field 3), then a controller-based search may be selected (or, as will be discussed below, an NVM-based search using under-the-array or next-to-the-array dedicated search logic may be selected);

The size and/or complexity of a search pattern where, for example, if a search pattern is relatively small (for example, the pattern can fit in a wordline), the NVM-based search may be selected (using, in particular, latch-based bitwise logic) and where, if the search pattern is relatively large and/or complex, the controller-based search may be selected;

A degree of fragmentation based, e.g., on a measure of the sequentiality of the searched data (based, e.g., on FTL information usually not known by the host device), with the SSD controller comparing the measure of sequentiality to a threshold (which may be set or optimized, e.g., based on latency and/or power consumption) and, if the measure exceeds the sequentiality threshold, a controller-based search may be selected, or, otherwise, an NVM-based search may be selected;

An allowable number of flipped bits between a search pattern and data sensed from the blocks of the NVM die where, e.g., if no flipped bits are allowed (and so error correction should be performed on all search candidates), a controller-based search is selected, or, otherwise, an NVM-based search may be selected (where some number of flipped bits are permitted during the search); and Whether data stored in the NVM die is scrambled, with a controller-based search selected if the data is scrambled (so that the controller can then de-scramble the data before searching the data), or with an NVM-based search selected if the data is not scrambled (or if the NVM die is equipped with logic to descramble the data).

It is noted that the degree of fragmentation may also be assessed or determined based on the structure of the data and the complexity of a search criteria received from the host. In other words, the measure of sequentiality of the searched data is not the only way to assess and quantify the degree or amount of fragmentation involved in a search.

In some examples, a search may begin as an NVM-based search and then, if the search is terminated by the NVM die due, e.g., to exceeding a threshold number of flipped bits (for specific pages, for instance), a controller-based search is initiated. This is illustrated in FIG. 5, discussed next.

Figure 5:
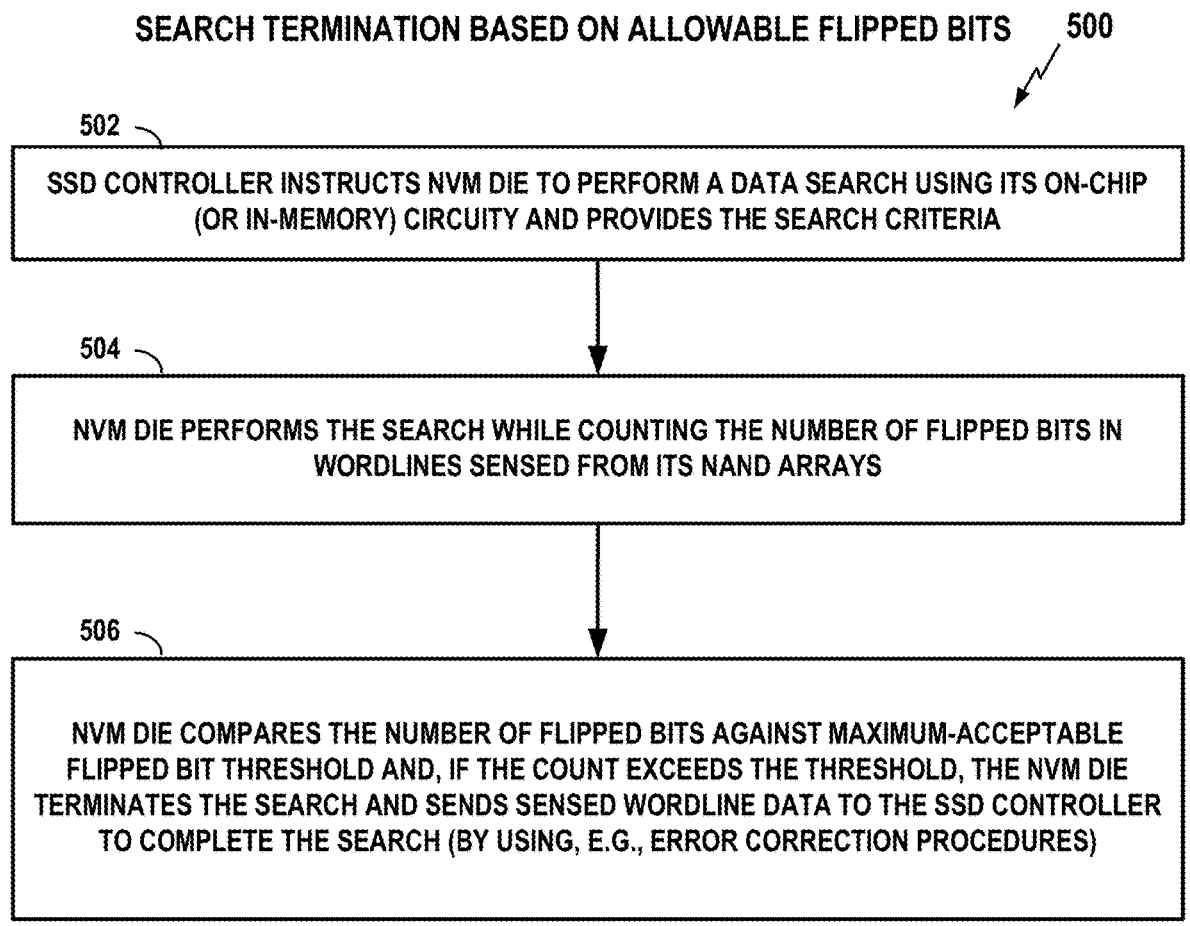
FIG. 5 illustrates an example of search termination operations for use by an apparatus having controller of an NVM die configured with on-chip search circuitry.

FIG. 5 summarizes operations 500 for use by an SSD controller (or other suitable controller or device) and an NVM die (equipped for on-chip or in-memory search) for modifying a search based on a number of flipped bits. At block 502, the SSD controller instructs the NVM die to perform a data search using its on-chip circuitry and provides the search criteria. At block 504, the NVM die performs the search while counting the number of flipped bits in wordlines sensed from its NVM NAND arrays. At block 506, the NVM die compares the number of flipped bits against maximum-acceptable (or maximum permissible) flipped bit threshold and, if the count exceeds the threshold, the NVM die terminates the search and sends the sensed wordline data to the SSD controller to complete the search by using, for example, ECC procedures to correct the flipped bits.

As noted above, the SSD controller may break up a large and/or complicated search pattern into sub-patterns, some of which may be searched for using the NVM-based search. Other portions of a large/complicated search pattern might be searched for using the SSD controller based on sensed data sent to it from the NVM die. This is illustrated in FIG. 6

FIG. 6 summarizes operations 600 for use by an SSD controller (or other suitable device) and an NVM die (equipped for on-chip or in-memory search) for modifying a search based on a size and/or complexity of a search pattern. At block 602, the SSD controller analyzes an input search pattern received from a host device to determine its relative size and/or complexity based, for example, on a comparison of the pattern with various size and/or complexity thresholds. A size-based threshold might be a wordline size threshold so that, if the input search pattern exceeds a wordline, it is deemed to be large, but if the pattern is smaller than a wordline, it is deemed to be small. A complexity-based threshold might specify a maximum number of search criteria to be applied to the pattern. At block 604, if input search pattern is deemed to be large and/or complex, the SSD controller subdivides the pattern into smaller and/or less complex search patterns. At block 606, the SSD controller selectively submits one or more of the subdivided patterns to the NVM die for searching within the stored NVM data using on-chip search circuitry while, in some examples, searching for other subdivided patterns using the processor of the controller (based on data sensed from the NVM die). For example, portions of an input search pattern that fit within a wordline may be sent to the NVM die for processing by the on-chip search circuitry (as in block 310). Other portions of the input search pattern that do not fit within a wordline (and cannot be further subdivided to fit within a wordline) are searched for (as in block 308) by instructing the NVM die to sense and return all of the stored blocks needed to search for that portion of the pattern.

Note that these and other aspects of a search may be controlled externally by the host device and passed to the SSD controller via parameters that the host provides (for example, in block 302) or the various aspects of the search may be determined by the SSD internally based on various factors such as latency and power consumption.

Exemplary NVM Die Implementations and Methods

Figure 7:
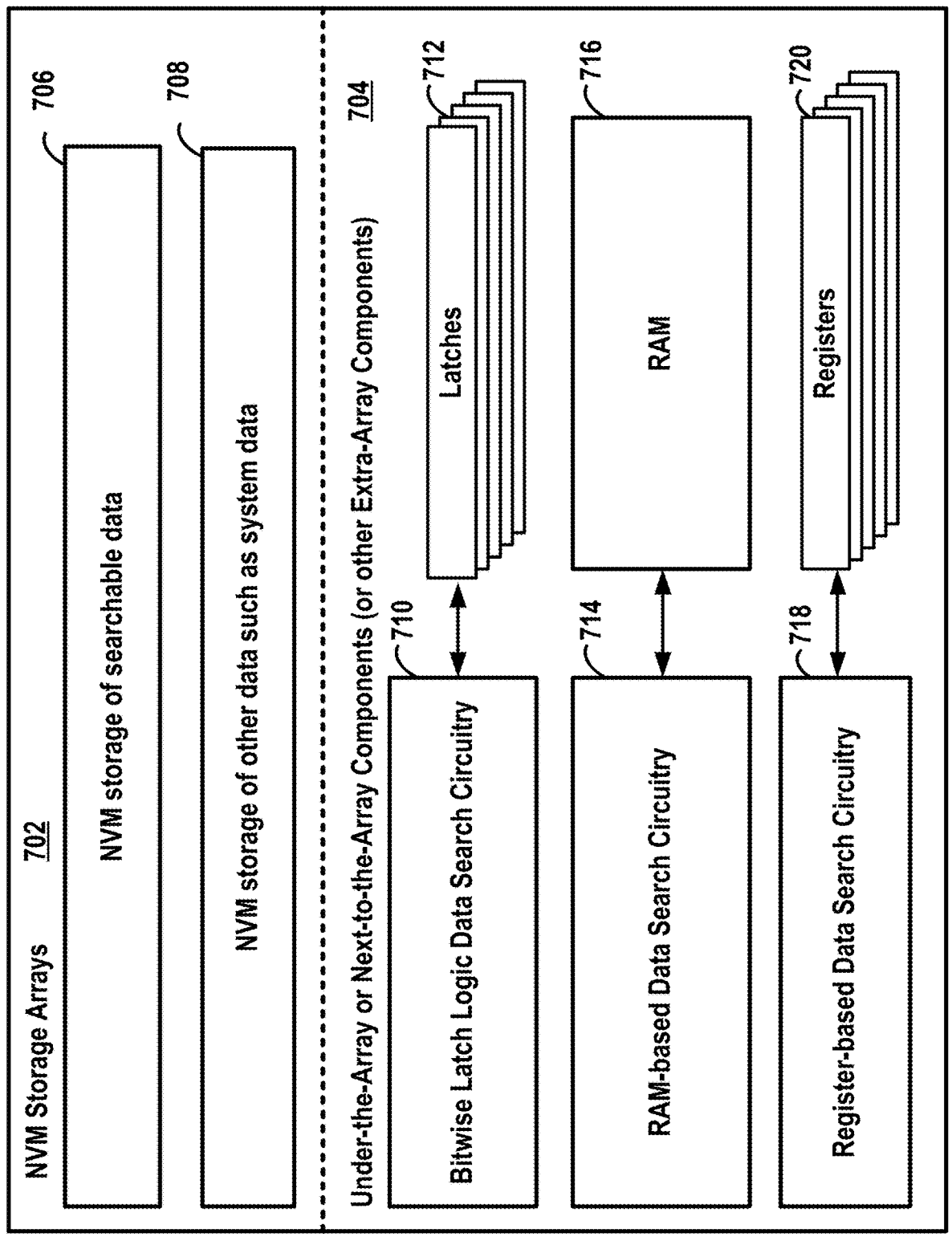
FIG. 7 illustrates an example of an NVM die having under-the-array or next-to-the-array dedicated search components configured for on-chip data search operations.

FIG. 7 illustrates a block diagram of an exemplary NVM die 700 that includes NVM storage array components 702 and under-the-array or next-to-the-array or other extra-array dedicated search processing components 704 (processing components 704). (Note that not all circuit or memory components that might be used in a practical NVM die are illustrated in the figure, such as input and output components, voltage regulation components, clocks and timing components, etc. Rather only some components and circuits are shown, summarized as block or schematic diagrams.) The NVM array components 702 include NVM storage 706 configured for storing searchable data (such as media files) and NVM storage 708 configured for storing other data such system. The under-the-array or next-to-the-array components may also be generally regarded as, or referred to as, extra-array components in the sense that they are formed, mounted, or positioned outside of the array, or may be referred to as ancillary components, auxiliary components, non-array components, non-top-of-the-array components, or non-embedded-in-the-array components.

In this example and for the sake of generality, the NVM processing components 704 include: bitwise latch logic search circuitry 710 and a set of latches 712 for use with the circuitry 712; RAM-based search circuitry 714 and a RAM 716 for use with the circuitry 714; and register-based search circuitry 718 and registers 720 for use with the circuitry 718. Exemplary search operations using these components are described below. It should be understood that in some examples, only some search components may be provided, such as only the bitwise latch logic search circuitry 710 and the set of latches 712 or only the RAM-based search circuitry 714 and the RAM 716. Three illustrative types of search components are shown since at least some dies might be provided with all three. If a particular NVM die is equipped with two or more different types of search circuitry, such as both latch logic search circuitry and RAM-based search circuitry, the NVM die may use one or the other, or a combination of the two, to perform a particular search. As already noted, in some examples, the SSD controller may instruct the NVM die to use a particular set of components, such as either the latch logic search circuitry or the RAM-based search circuitry to perform a particular search with the choice made, for example, based on the degree of fragmentation of the data (as indicated, e.g., by a measure of sequentiality). It is also noted that not all of the components shown in FIG. 7 as being "under the array" components need to necessarily be formed under the array. For example, at least some of the latches might not be under-the-array or next-to-the-array components. Still further, in some embodiments, the search circuitry may be configured as a state machine (or as a portion thereof).

FIG. 8 illustrates exemplary latch logic search procedures performed by the circuitry of a suitably-equipped NVM die. This procedure may incorporate a memory command that includes a data pattern to be searched for and its relative location within a page (e.g. a search for all pages having a certain value within a specific field). The command may be executed on a block or full flash plane in a sequence, where a NVM NAND flash die performs sensing sequentially wordline after wordline on all wordlines in a block/plane. Accordingly, for each sensing operation, the data may be latched in a first latch, and a logic operation then may be performed using additional latches to compare the sensed data to the searched data pattern. For example, this may be performed by ANDing the sensed data in the first latch with a MASK page having 1's in the specified search field and 0's elsewhere (located in a second latch) and then storing the AND result in a third latch. Next, the AND result in the third latch is XORed with a fourth latch containing the searched pattern and the result is stored in a fifth latch (or stored in place in the fourth latch). Finally, the number of 1's in the resulting XOR page are counted in order to check for a match between the sensed data and the search pattern. If a match is found the data will be transferred to the flash controller. Due to potential bit flips inherent to NVM NAND flash memory, the search success "match" criteria may take into account the number of allowed flipped bits (represented, e.g., by a percentage of the size of the searched term). When performing search, the hardware of the NVM die may count the number of mismatched bits in the XOR latch to determine see if it is less than a specified value. This may be achieved using a Bit Scan command in the NVM NAND die or using Direct Memory Count (DMC) functionality in the SSD controller. Note that not all bits must be counted, as the match threshold might be satisfied before all bits are counted.

Summarizing, beginning at block 802 of FIG. 8, the circuitry of the NVM die perform a series of iterative serial sensing operations within the NVM array (e.g. wordline after wordline, serially rather than in parallel, for all wordlines in a block/plane) to sense data and, for each iterative operation, latch the sensed data in a first latch. At block 804, for each iterative operation, the circuitry of the NVM die performs a bitwise logic operation on the sensed data using a second latch to compare the sensed data to an input search pattern by, e.g., ANDing the sensed data that resides in the first latch with a MASK page located in a second latch having 1's in a specified search field and 0's elsewhere, and store the result in a third latch. At block 806, for each iterative operation, the circuitry of the NVM die XORs the result stored in the third latch with a fourth latch containing the search pattern (e.g. the pattern to be searched received from the SSD controller) and stores the resulting XOR page in a fifth latch (or store in place in the fourth latch). At block 808, for each iterative operation, the circuitry of the NVM die counts the number of 1's in the resulting XOR page to detect a match between the sensed data and the search pattern, and, if a match is found (based, e.g. on comparing the count of mismatched bits against a match threshold while taking into account a number of allowed flipped bits as represented, e.g., by a percentage of the size of the search pattern), transfer the data to the SSD controller or, if no match is found after completion of all iterations of the search, send a signal to the SSD controller to indicate the search pattern was not found within the blocks/planes searched. If the amount of positive search results is small, then the data can be decoded inside the SSD controller (after it has been sent to the controller from the NVM die) to assure a correct match, therefore eliminating false positives.

Note also that the search pattern (or fragment) may be smaller than a whole wordline (where each text word is often ten bytes long) and so the aforementioned latch mask may be prepared accordingly by NVM flash management firmware.

Figure 9:
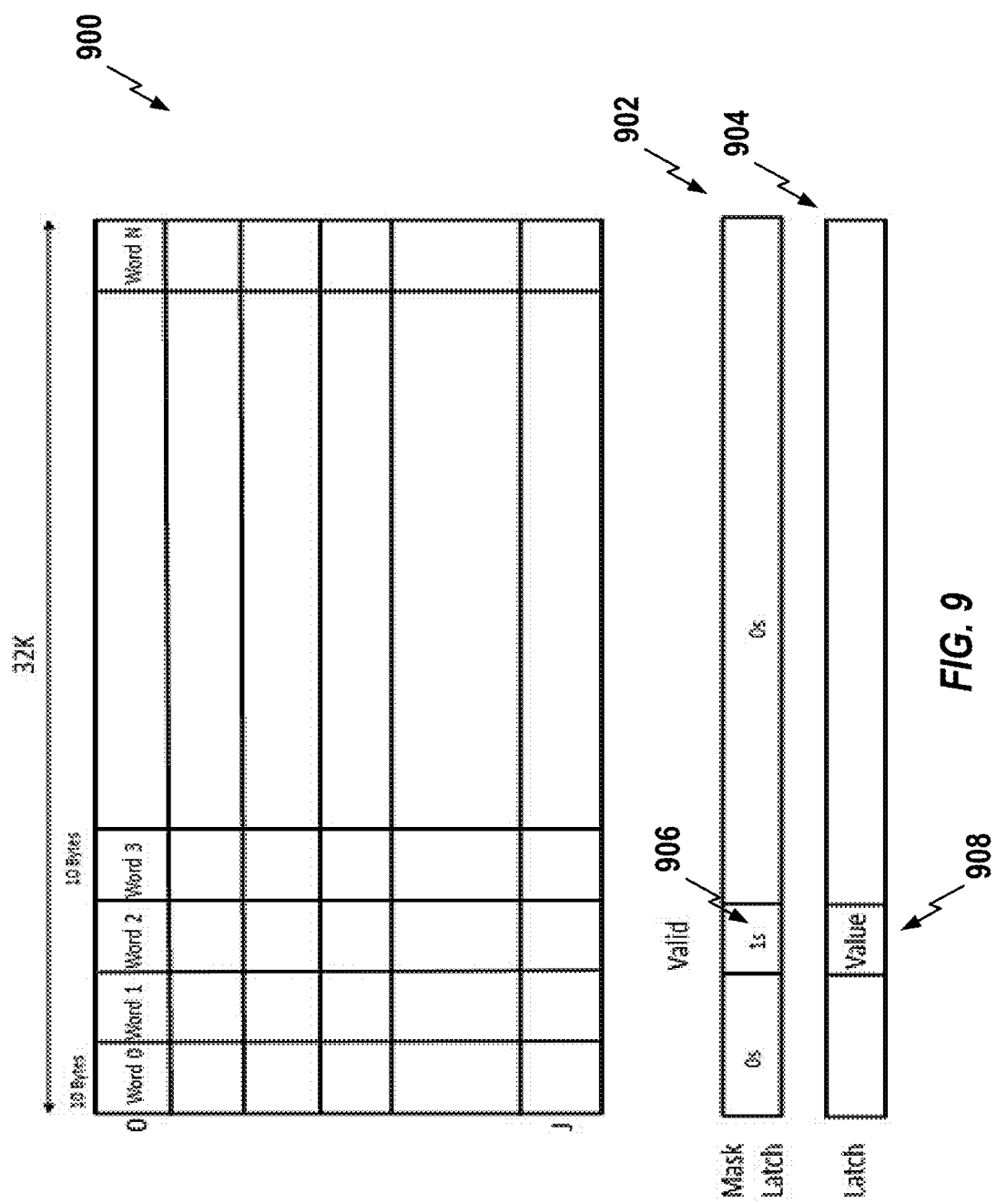
FIG. 9 illustrates exemplary latches and wordlines for use with latch logic.

FIG. 9 illustrates an example of a mask for use with a wordline search. Briefly, FIG. 9 illustrates a set of wordlines 900, each having words (or tokens), each ten bytes long, where the wordlines are denoted 0, 1, 2, . . . , J. FIG. 9 also illustrates a mask latch 902 (which may be the second latch referred to above) and a latch 904 (which may be the first latch above that contains the sensed wordline). In the example of FIG. 9, the mask latch 902 is set to all 0's except for one word (token) 906 that is set to all 1's. The latch 904 has a series of bitwise values that are ignored with the exception of values 908 corresponding in location to the 1's of the mask, which are thus "valid" values for the purposes of the search procedure.

Matching operations may be performed on more than one word (token) so that only wordlines that include the combination of two (or more) desired tokens are considered a match. This is illustrated by way of FIG. 10.

Figure 10:
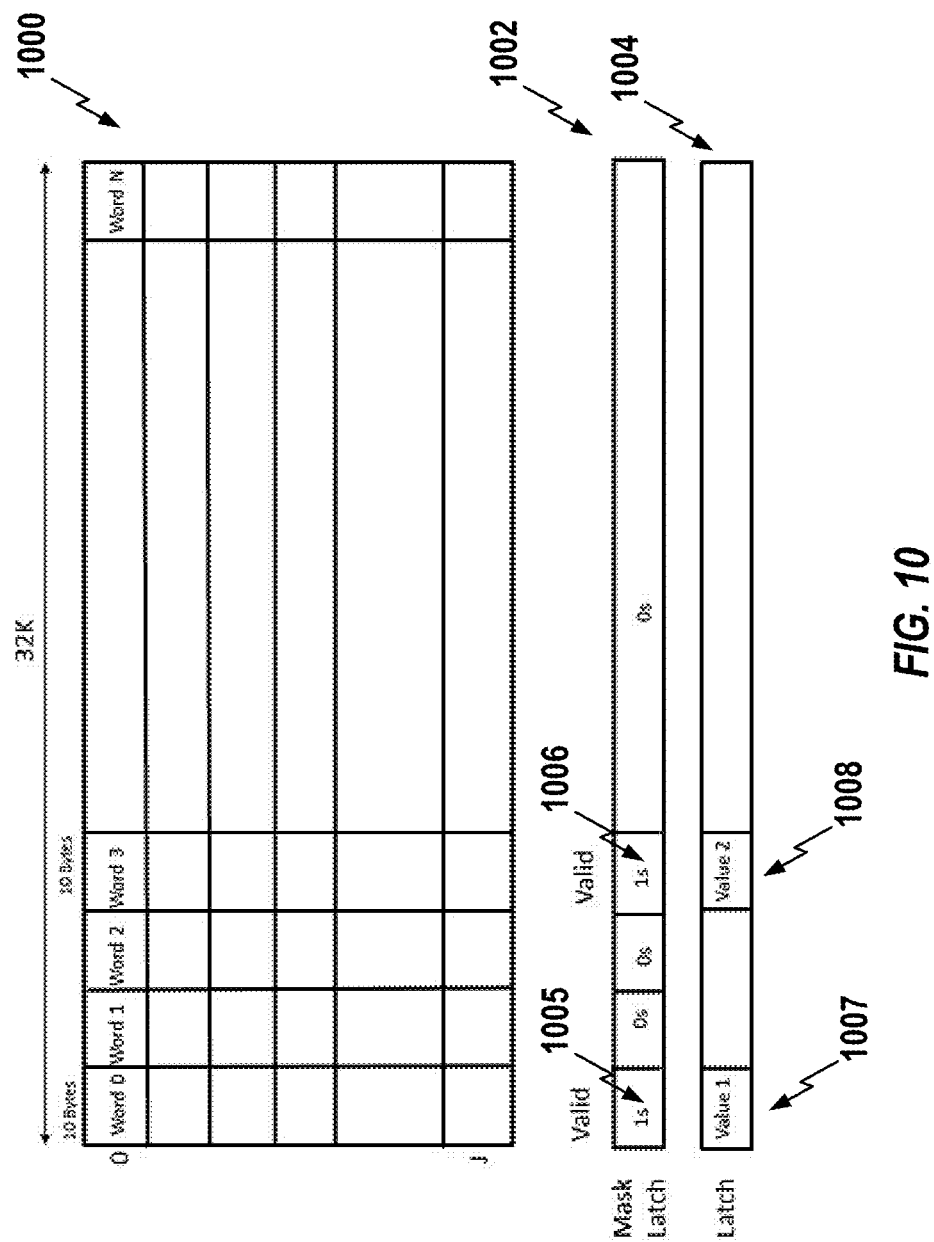

Briefly, FIG. 10 again illustrates a set of wordlines 1000, each having words (or tokens), each ten bytes long, where the wordlines are denoted 0, 1, 2, . . . , J. The figure also illustrates a mask latch 1002 and another latch 1004 (which may be the first latch referred to above that contains a sensed wordline). In the example of FIG. 10, the mask latch 1002 has two tokens 1005 and 1006 set to all 1's. The latch 1004 has a series of bitwise values that are ignored, with the exception of any values 1007 and 1008 corresponding in location to the 1's of the mask, which are again "valid" values for the purposes of the search procedure.

Additionally, more complex search criteria may be used. For example, certain bits in the searched pattern may be considered as "Don't Care" or "wildcard" values, by setting their values in both the MASK page and the corresponding pattern page as 0's. Moreover, as noted above, in some cases the data stored to the NVM die may be scrambled. To accommodate searching of scrambled data, the NVM die may be provided with a die-based scrambler so that data is descrambled when it is sensed from the array into the latch. Alternatively, the scrambling pattern of the search data field may be incorporated as part of the search command, so that it can be applied to the search data pattern. The scrambling pattern may also be a function of the wordline/page index (which is known by the NVM state machine/circuitry that performs the search and hence can be taken into consideration). (It is noted that scrambling of data may be employed by a host if, for example, the host data is non-symmetrical, e.g., many 1's together, as that can be problematic for NAND storage.)

FIG. 11 illustrates exemplary RAM-based or register-based search procedures performed by the under-the-array or next-to-the-array processing components or circuitry of a suitably-equipped NVM die. In this embodiment, matching wordline data, or only some part of the wordline, is stored under-the-array or next-to-the-array in a RAM or in registers, and the automatic iterative scan over all wordlines in the search range continues until the scan ends. By using RAM or a sufficient number of registers, the search may store a set of wordline matches for further processing in the circuitry of the NVM die (as part of the search command) with only the final processed results sent to the SSD controller. The further processing may operate to ensure that only a fully-matched wordline is sent to the SSD controller, thus saving transfer power and time of all the non-selected data. For example, some amount of error correction and detection may be performed using suitably-equipped processing components or circuitry. (Alternatively, the full set of wordline matches may be transferred to the SSD controller for further processing therein.)

Summarizing, beginning at block 1102 of FIG. 11, the under-the-array or next-to-the-array dedicated search components or circuitry of the NVM die (processing components) performs a series of serially sensing operations within the NVM array (e.g. wordline after wordline, serially rather than in parallel, for all wordlines in a block/plane) to sense data and then stores (processes or uses) all of the sensed data in RAM or in memory registers. At block 1104, the processing components search the sensed data to detect possible matches to an input search pattern by, for example, serially scanning all wordlines of a block of sensed data to separately store a plurality of candidate matching wordlines. At 1106, the processing components perform logic processing of the possible matches (e.g. the candidate wordlines) to identify a fully-matched wordline within possibly unstructured data. At 1108, the processing components send only the fully-matched wordline to the SSD controller (or sends all potentially-matching candidate wordlines to the SSD controller, if a full match is not found, for further processing in the SSD controller).

Using RAM-based or register-based under-the-array or next-to-the-array dedicated search logic as in FIG. 11 may allow for functionality that is not available when using bitwise latch logic-based operations (as discussed above). In particular, the RAM-based or register-based under-the-array or next-to-the-array dedicated search logic may allow scanning a serially-sensed page and searching for an information pattern, in case the relative location of the data within the page is not known, as in the case of unstructured data. It should be noted that in a multi-die architecture, four, eight, sixteen or more dies may share a bus to the controller, and so a possible bottleneck in the serial transfer time of all wordline data to the controller may be avoided. For example, with a 533 Mbyte/sec toggle mode and with 48 Kbyte data per WL, the transfer time may be about 0.09 microsecond.

The following additional observations and discussions apply to one or more of the embodiments disclosed herein. Aspects of the disclosure are applicable to both single level cell (SLC) and multiple level cell (MLC) technologies (MLC for two or more bits per cell). For example, since pattern matching may be performed using latches, there is no need to distinguish between SLC and MLC, i.e. exemplary latch-based methods discussed herein may apply equally to both. When a search command is issued by a host device, the block address (or range) is known (or can be derived from the host LBAs), and the SLC/MLC identity of the block is known to a Flash Management (FM) component of the NVM die (which is a standard NAND flash die component provided in many current NAND flash memories). This identity may also be returned through the status of the search command, if the host wants the information. In many current flash memory devices, data is written page by page. Hence, for MLC, Lower and Upper pages (LP and UP) of the same wordline are distinguished. For the purposes of on-chip searching, each may be treated independently of the other.

Insofar as implementing the on-chip logic is concerned, the circuitry that performs the pattern matching (in the die itself) may be implemented with CMOS Under Array (CUA) technologies (or the basic search method may also be implementing using bit comparators). Current NAND technology supports operations between latches (such as XOR operations) and counting over a latch (e.g. Bit Scan operations). The basic search methods disclosed herein for searching for a data pattern can use these operations or modified versions thereof. For the more complex features described above, such as those involving scrambled data, any additional needed logic may be implemented via CUA. CUA allows for more logic to be placed close to the NAND die at a relatively low cost, which enables more complex logic. It is noted that at least some existing NAND flash devices may use latches and latch logic to read triple-level cells (TLC) and so, in those embodiments, the bitwise latch operations may be modified, as appropriate, to provide the latch logic search operations disclosed herein.

Insofar as error handling is concerned, exemplary procedures for error handling (e.g. bits flipped in memory as a result of natural degradation of the memory die) are discussed above. The following additional observations are provided. Due to potential bit flips inherent in flash memory, the search success "match" criteria may also include the number of allowed flipped bits, which can be represented by a percentage of the size of the searched term. When performing search, the hardware may count the number of mismatched bits in the XOR latch to determine if it is less than the specified value. This may be performed using a Bit Scan command in the NAND die or using DMC functionality in the SSD controller. Not all bits must be counted, as this threshold may be satisfied before all bits are counted. If the amount of positive search results is small, then that data can be decoded inside the controller to achieve a perfect (or near perfect) match, therefore eliminating (or greatly reducing) false positives. In this manner, similar patterns can be sent to the controller where the match can be checked. In other words, the NVM die transfers only a limited amount of data compared to other approaches where all data is transferred to the controller. The threshold used for match indication can be set such that the false negative (misdetection) probability is as low as desired (specifically, below an unrecoverable bit error rate (UBER)). In addition, as a further measure, in case a match is not found, a complete search can be performed by the SSD controller.

In the following sections, various features are generally discussed and summarized.

First Example Process or Procedure

Figure 12:
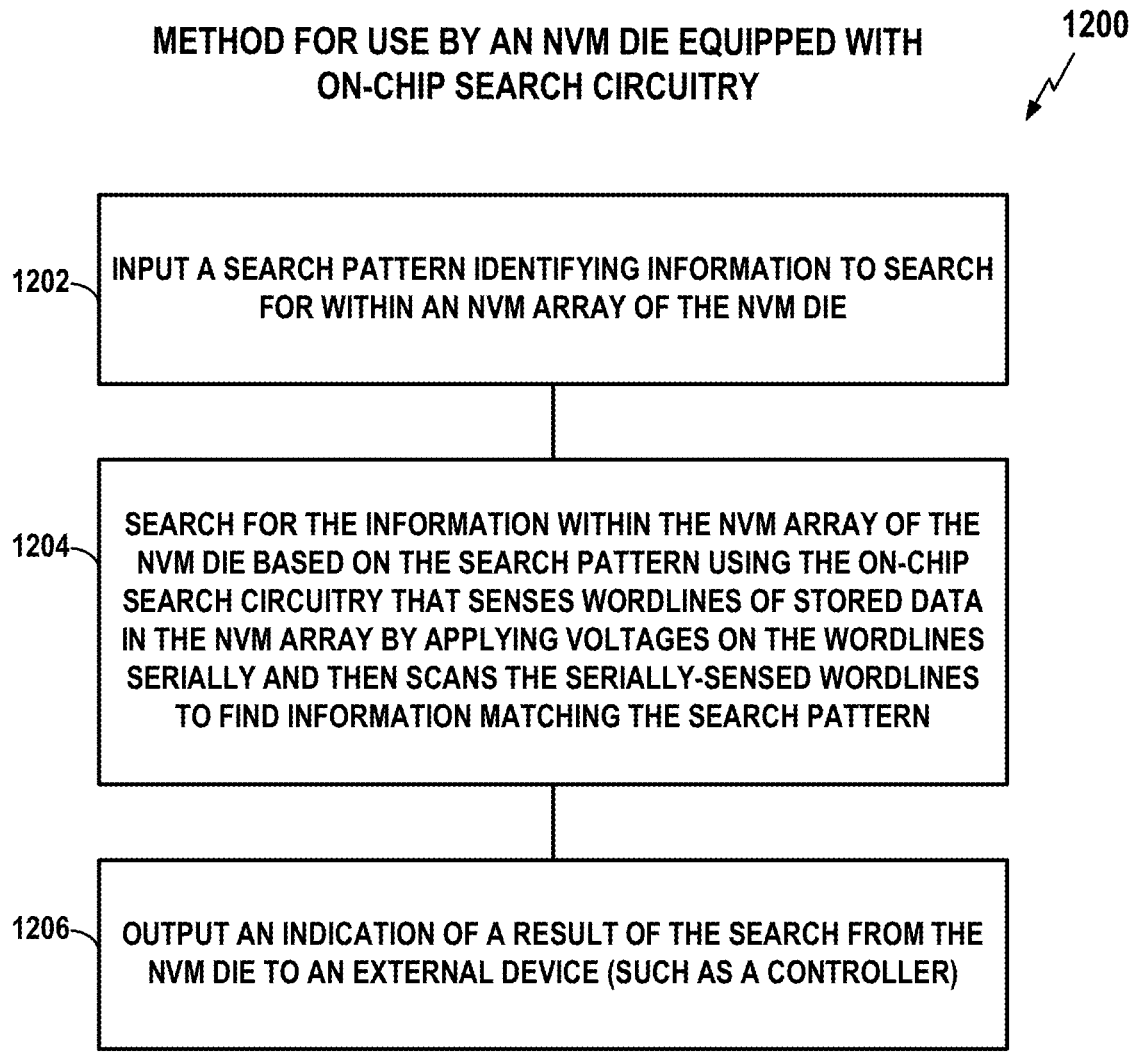
FIG. 12 illustrates an example of a process for use by an NVM die equipped with on-chip search circuitry.

FIG. 12 illustrates a process 1200 in accordance with some aspects of the disclosure. The process 1200 may take place within an NVM die equipped with on-chip (or in-memory) search circuitry such as within an under-the-array or next-to-the-array dedicated search logic circuit formed in the NVM die. The NVM die may be located in an SSD or other suitable data storage apparatus. However, in various aspects within the scope of the disclosure, the process 1200 may be implemented by any suitable apparatus or device capable of performing the operations. At block 1202, the NVM die inputs a search pattern identifying information to search for within an NVM array of the NVM die. The search pattern may be input from an SSD controller that controls the operation of the NVM die. At block 1204, the NVM die searches for the information within the NVM array of the NVM die based on the search pattern using the on-chip (or in-memory) search circuitry that senses wordlines of stored data in the NVM array by applying voltages on the wordlines serially and then scans the serially-sensed wordlines to find information matching the search pattern. At block 1206, the NVM die outputs an indication of a result of the search from the die to an external device, such as an SSD controller.

In some examples, searching for the information includes: identifying a match between the sensed wordline data and the input search pattern while ignoring wildcard bits by setting wildcard bit values in a mask page and the input search pattern to predetermined matching values; and applying the mask page to the sensed wordline data during the search for the data. In other examples, searching for the information includes identifying a match between the sensed wordlines of data and the input search pattern by performing matching operations on two or more tokens within a wordline so that only wordlines that include a combination of at least two desired tokens specified in the input search pattern are identified as a match.

In some examples, where the data stored in the NVM array is scrambled, searching for the information includes de-scrambling the sensed data using an on-chip descrambler circuit. In other examples, a scrambling pattern is input by the circuitry as a portion of a search command, and the scrambling pattern is applied to the input search pattern before the search pattern is applied to sensed data. These are just some examples.

Second Example Process or Procedure

Figure 13:
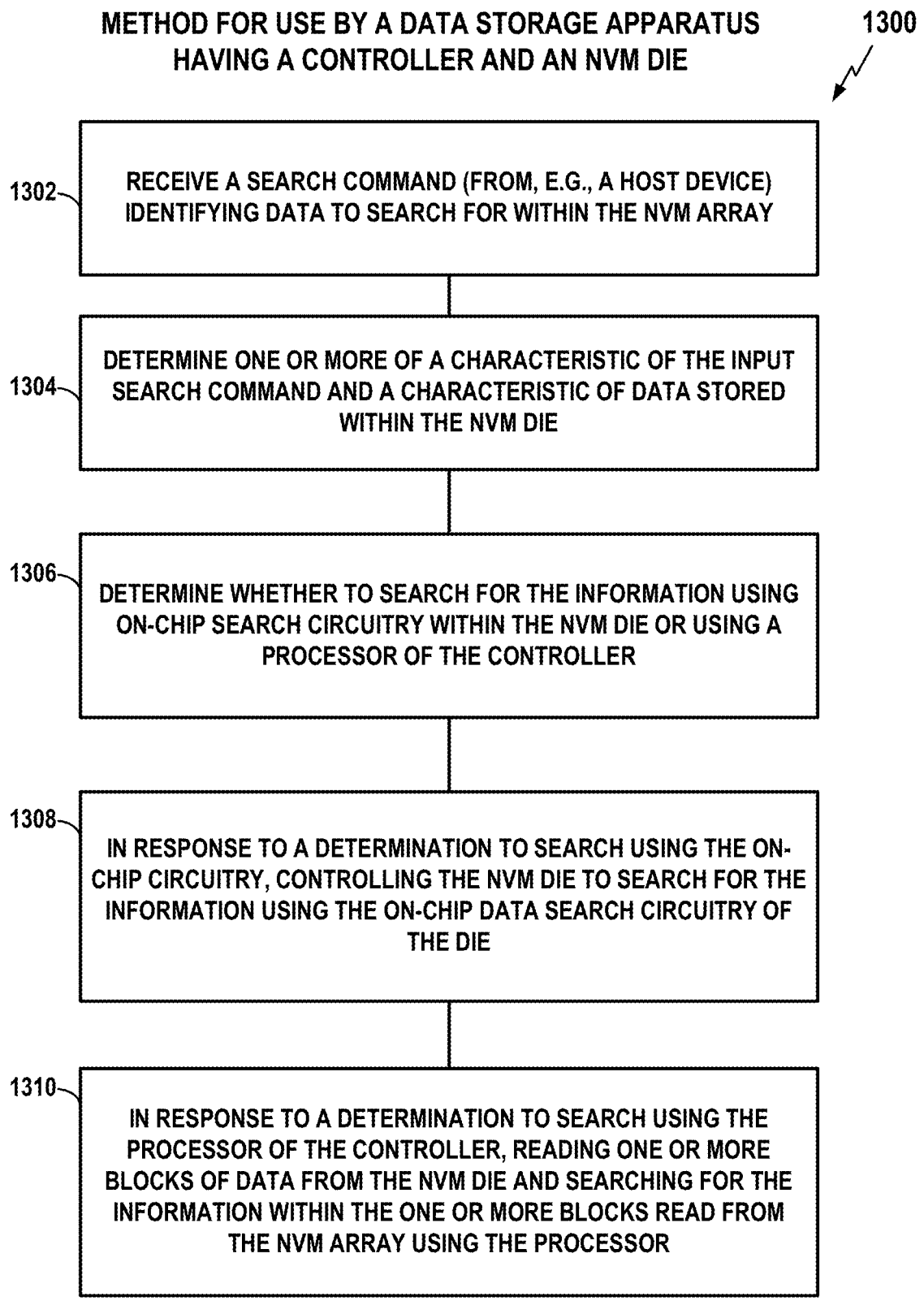
FIG. 13 illustrates an example of a process for use by an apparatus having a controller and an NVM die equipped with on-chip search circuitry.

FIG. 13 illustrates another process 1300 in accordance with some aspects of the disclosure. The process 1300 may take place within a data storage apparatus having a controller and an NVM die, such within an SSD or other suitable apparatus. At block 1302, the apparatus receives a search command identifying information to search for within the NVM die (i.e. data to be searched for within the NVM arrays of the die). The search command may be received, for example, from a host device. At block 1304, the apparatus determines one or more of a characteristic of the input search command and a characteristic of data stored within the NVM die. The characteristic may be one or more of: a degree a fragmentation of data to be searched; a structure of data on the NVM die; a complexity of a search criteria of the search command; a size and/or complexity of a search pattern specified in the search command; a measure of sequentiality of data on the NVM die; an allowed number of flipped bits in matching search data; and whether or not data stored on the NVM die is scrambled. At block 1306, the apparatus determines whether to search for the information using on-chip search circuitry within the NVM die or using a processor of the controller based on the determined characteristic. At block 1308, in response to a determination to search using the on-chip circuitry, the apparatus controls the NVM die to search for the information using the on-chip data search circuitry of the NVM die. At block 1310, in response to a determination to search using the processor of the controller, the apparatus reads one or more blocks of data from the NVM die and searches for the information within the one or more blocks read from the NVM array using the processor.

In examples where the on-chip data search circuitry of the NVM array includes (a) latch-based search circuitry configured to perform bitwise latch logic search operations using one or more latches to search for the information; and (b) under-the-array or next-to-the-array dedicated search circuitry configured to search for the information, the method may further include controlling the on-chip circuitry of the NVM array to use either the latch-based search circuitry or the under-the-array or next-to-the-array dedicated search circuitry to search for the information based on the one or more characteristics.

First Exemplary Apparatus

Figure 14:
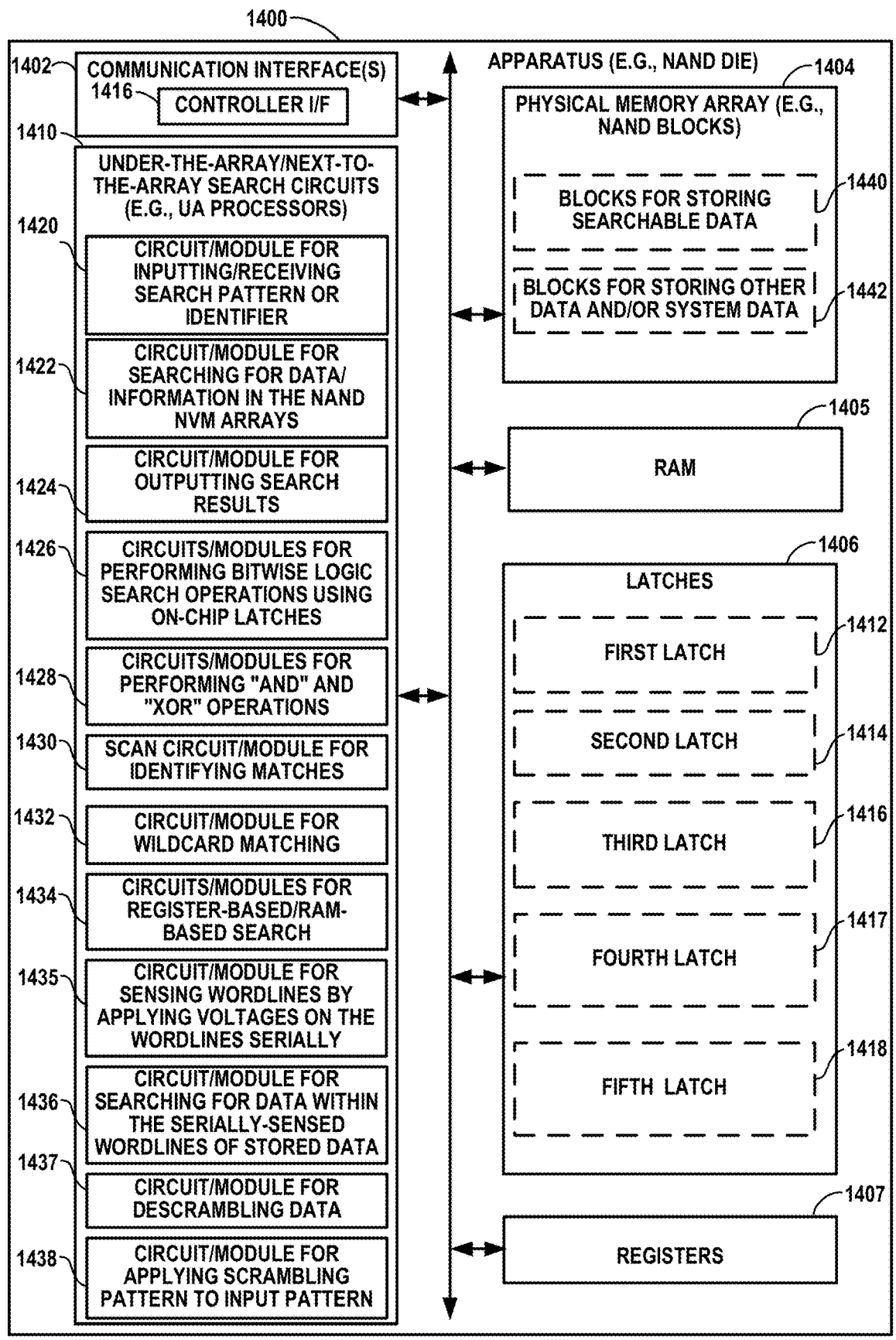
FIG. 14 illustrates an example of a data storage apparatus (e.g., an NVM die), particularly highlighting exemplary components for performing an on-chip data search.

FIG. 14 illustrates an embodiment of an apparatus 1400 configured according to one or more aspects of the disclosure. The apparatus 1400, or components thereof, could embody or be implemented within a NAND die or some other type of NVM device that supports data storage. In various implementations, the apparatus 1400, or components thereof, could be a component of a processor, a controller, an SSD, a computing device, a personal computer, a portable device, or workstation, a server, a personal digital assistant, a digital camera, a digital phone, an entertainment device, or a medical device or some other device that processes data or controls data storage.

The apparatus 1400 includes a communication interface 1402, a physical memory array (e.g., NAND blocks) 1404, a RAM 1405, a set of latches 1406, a set of registers 1407, and a set of under-the-array (UA) or next-to-the-array search processing circuits 1410 (e.g., at least one UA processor and/or other suitable UA circuitry). These components can be coupled to and/or placed in electrical communication with one another via suitable components, represented generally by the connection lines in FIG. 14. Although not shown, other circuits such as timing sources, peripherals, voltage regulators, and power management circuits may be provided, which are well known in the art, and therefore, will not be described any further.

The communication interface 1402 provides a means for communicating with other apparatuses over a transmission medium. In some implementations, the communication interface 1402 includes circuitry and/or programming (e.g., a program) adapted to facilitate the communication of information bi-directionally with respect to one or more devices in a system. In some implementations, the communication interface 1402 may be configured for wire-based communication. For example, the communication interface 1402 could be a bus interface, a send/receive interface, or some other type of signal interface including circuitry for outputting and/or obtaining signals (e.g., outputting signal from and/or receiving signals from an SSD controller). The communication interface 1402 serves as one example of a means for receiving and/or a means for transmitting.

The physical memory array 1404 may represent one or more NAND blocks. The physical memory array 1404 may be used for storing data to be searched or processed by the UA circuits 1410 or some other component of the apparatus 1400. The physical memory array 1404 may be coupled to the UA circuits 1410 such that the UA circuits 1410 can read or sense information from, and write or program information to, the physical memory array 1404. That is, the physical memory array 1404 can be coupled to the UA circuits 1410 so that the physical memory array 1404 is accessible by the UA circuits 1410.

The latches 1406 may include one or more of: a first latch 1412; a second latch 1414; a third latch 1416; a fourth latch 1417, and a fifth latch 1418. See, above, for descriptions of exemplary values that may be stored in the various latches, such as mask values, search patterns, XOR pages, AND pages, etc.

The UA circuits 1410 are arranged or configured to obtain, process and/or send data, control data access and storage, issue or respond to commands, and control other desired operations. For example, the UA circuits 1410 may be implemented as one or more processors, one or more controllers, and/or other structures configured to perform functions.

According to one or more aspects of the disclosure, the UA circuits 1410 may be adapted to perform any or all of the under-the-array or next-to-the-array features, processes, functions, operations and/or routines described herein. For example, the UA circuits 1410 may be configured to perform at least some of the steps, functions, and/or processes described with respect to FIGS. 1-13. As used herein, the term "adapted" in relation to the processing circuit 1410 may refer to the UA circuits 1410 being one or more of configured, employed, implemented, and/or programmed to perform a particular process, function, operation and/or routine according to various features described herein. The UA circuits 1410 may include a specialized processor, such as an application specific integrated circuit (ASIC) that serves as a means for (e.g., structure for) carrying out operations described in conjunction with FIGS. 1-13. The UA circuits 1410 serves as one example of a means for processing. In various implementations, the UA circuits 1410 may provide and/or incorporate, at least in part, the functionality described above for the UA components 704 of FIG. 7.

According to at least one example of the apparatus 1400, the processing circuit 1410 may include one or more of: circuit/modules 1420 configured for inputting/receiving a search pattern or other search parameters or criteria such as an identifier or indicator of data or information to search for (e.g. requested data); circuit/modules 1422 configured for searching for the data or information in the NAND NVM arrays; a circuit/module 1424 configured for outputting search results; circuits/modules 1426 configured for performing bitwise logic search operations using latches 1406; circuits/modules 1428 configured for performing "AND" and "XOR" operations on data in the latches 1406; scan circuit/module 1430 configured for identifying matches (between, for example, tokens in sensed data and tokens in an input search pattern) wherein the scan circuitry is configured to scan a sensed page to search for an input search pattern where a relative location of data to be searched for within the sensed page is not known; a circuit/module 1432 configured for wildcard matching; circuits/modules 1434 configured for performing register-based and/or RAM-based searches (using RAM 1405 and/or registers 1407); a circuit/module 1435 configured for sensing wordlines by applying voltages on the wordlines serially (rather than in parallel); a circuit/module 1436 configured for searching for data or information within the serially-sensed wordlines of stored data; a circuit/module 1437 configured for descrambling data (so as to allow sensed data to be descrambled data before it is searched for an input pattern); and a circuit/module 1438 configured for applying a scrambling pattern received from an SSD controller to an input search pattern (so as to allow an input pattern to be searched for within scrambled data in NAND blocks 1404). These and other features, functions or components of the processor 1510 are discussed and described above, and hence are not described in detail in this discussion of FIGS. 15 and 16.

In at least some examples, means may be provided for performing the functions illustrated in FIG. 14 and/or other functions illustrated or described herein. For example, the means may include one or more of: means, such as circuit/module 1420, for inputting/receiving a search pattern or other search parameters or criteria; means, such as circuit/module 1422, for searching for data or information in the NAND NVM arrays; means, such as circuit/module/component 1424, for outputting search results; means, such as circuit/module 1426, for performing bitwise logic search operations; means, such as circuit/module 1428, for performing "AND" and "XOR" operations; means, such as scan circuit/module 1430, for identifying matches wherein the scan circuitry is configured to scan a sensed page to search for an input search pattern where a relative location of data to be searched within the sensed page is not known; means, such as circuit/module 1432, for wildcard matching; means, such as circuit/module 1434, for performing register-based and/or RAM-based searches; means, such as circuit/module 1435, for sensing wordlines by applying voltages on the wordlines serially; means, such as circuit/module 1436, for searching for data within the serially-sensed wordlines of stored data; means, such as circuit/module 1437, for descrambling data; and means, such as circuit/module 1437, for applying a scrambling pattern (e.g. received from an SSD controller) to an input search pattern.

Second Exemplary Apparatus

Figure 15:
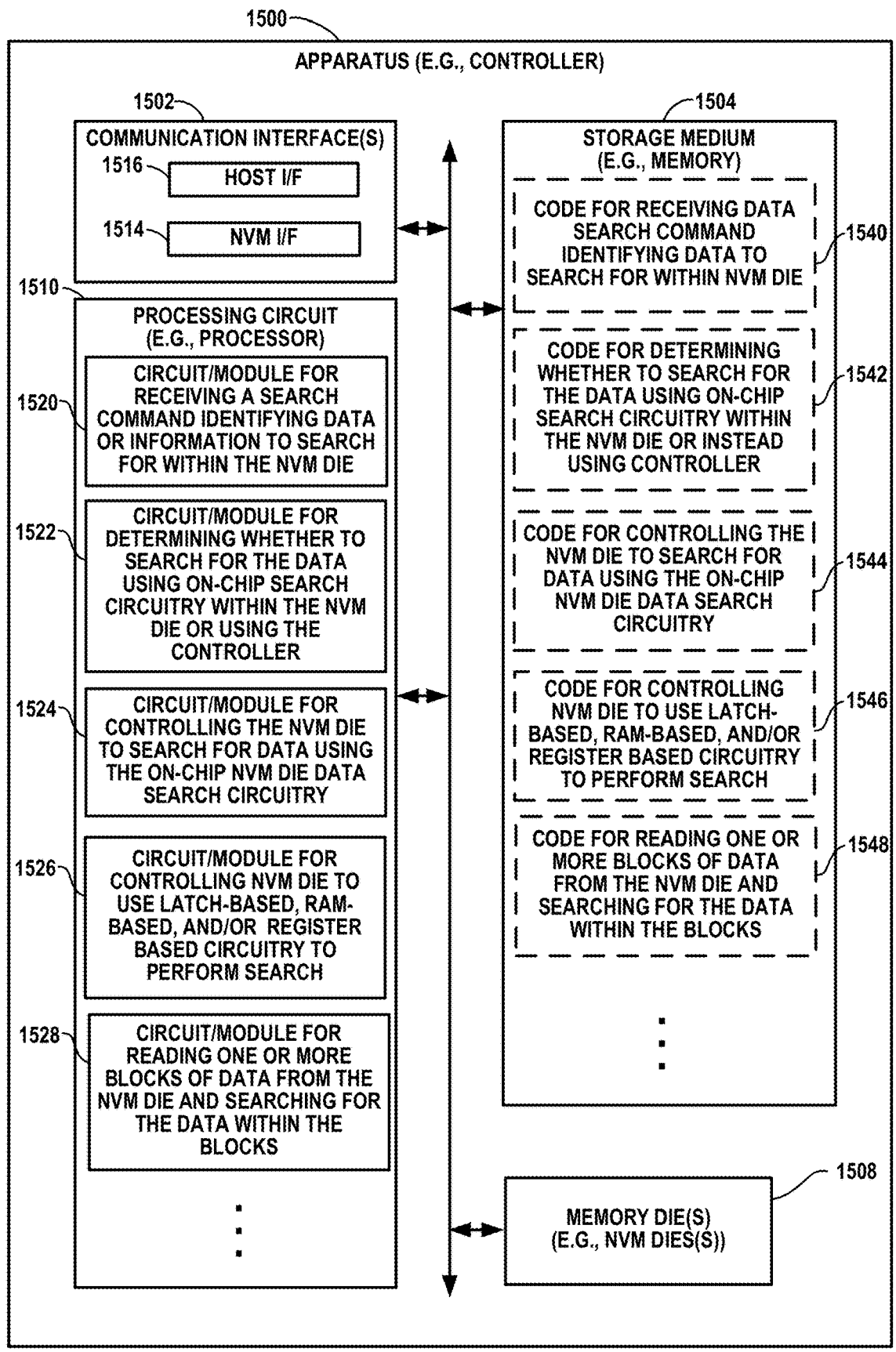
FIG. 15 illustrates an example of a data storage apparatus (e.g., a controller), particularly highlighting exemplary components for controlling an on-chip data search performed by a separate NVM die.
Figure 16:
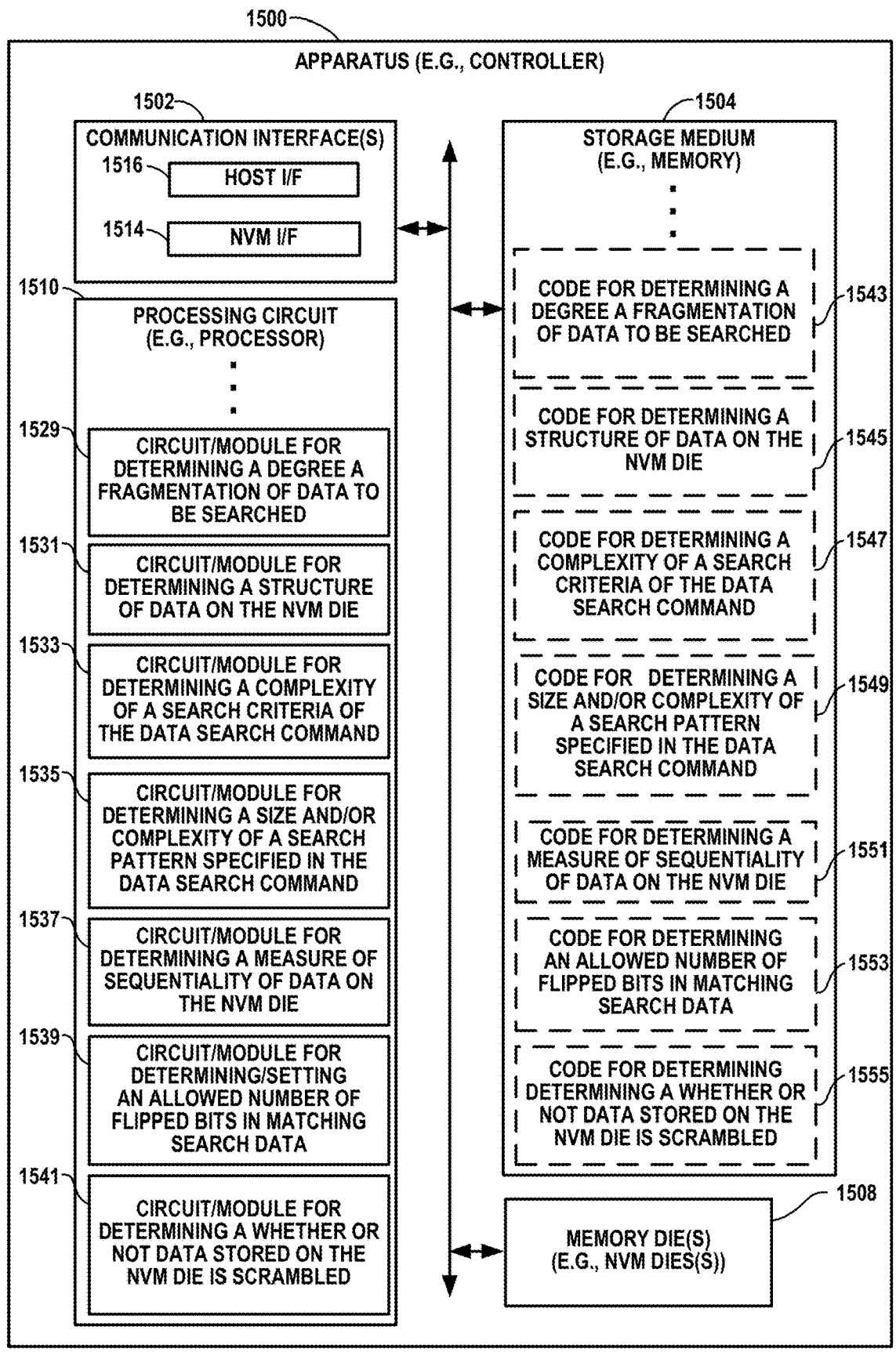
FIG. 16 illustrates further aspects of the data storage apparatus (e.g., controller) of FIG. 15, particularly highlighting additional exemplary components for controlling an on-chip data search performed by a separate NVM die.

FIGS. 15-16 illustrate an embodiment of an apparatus 1500 configured according to one or more other aspects of the disclosure. The apparatus 1500, or components thereof, could embody or be implemented within an SSD controller, a host device, or some other type of device that controls data storage.

The apparatus 1500 includes a communication interface 1502, a storage medium 1504, a memory array (e.g., an NVM memory circuit) 1508, and a processing circuit 1510 (e.g., at least one processor and/or other suitable circuitry). These components can be coupled to and/or placed in electrical communication with one another via a signaling bus or other suitable component, represented generally by the connection lines in FIG. 15. The signaling bus may include any number of interconnecting buses and bridges depending on the specific application of the processing circuit 1510 and the overall design constraints. The signaling bus links together various circuits such that each of the communication interface 1502, the storage medium 1504, and the memory array 1508 are coupled to and/or in electrical communication with the processing circuit 1510. The signaling bus may also link various other circuits (not shown) such as timing sources, peripherals, voltage regulators, and power management circuits which will not be described further.

Note that some of the components of the processing circuit 1510 are shown in FIG. 15 while others are shown in FIG. 16. Likewise, some of the components of the storage medium 1504 are shown in FIG. 15 while others are shown in FIG. 16. This is done merely to accommodate the illustration of the many components. It should be understood that particular implementations of the apparatus may include all or some of the illustrated components.

The communication interface 1502 provides a means for communicating with other apparatuses over a transmission medium. In some implementations, the communication interface 1502 includes circuitry and/or programming (e.g., a program) adapted to facilitate the communication of information bi-directionally with respect to one or more devices in a system. In some implementations, the communication interface 1502 may be configured for wire-based communication. For example, the communication interface 1502 could be a bus interface, a send/receive interface, or some other type of signal interface including drivers, buffers, or other circuitry for outputting and/or obtaining signals (e.g., outputting signal from and/or receiving signals into an integrated circuit). The communication interface 1502 serves as one example of a means for receiving and/or a means for transmitting.

The memory array 1508 may represent one or more memory devices such as a NAND die. In some implementations, the memory array 1508 and the storage medium 1504 are implemented as a common memory component. The memory array 1508 may be used for storing data that is manipulated by the processing circuit 1510 or some other component of the apparatus 1500.

The storage medium 1504 may represent one or more computer-readable, machine-readable, and/or processor-readable devices for storing programming, such as processor executable code or instructions (e.g., software, firmware), electronic data, databases, or other digital information. The storage medium 1504 may also be used for storing data that is manipulated by the processing circuit 1510 when executing programming. The storage medium 1504 may be any available media that can be accessed by a general purpose or special purpose processor, including portable or fixed storage devices, optical storage devices, and various other mediums capable of storing, containing or carrying programming.

By way of example and not limitation, the storage medium 1504 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a RAM, ROM, PROM, EPROM, an EEPROM, ReRAM, a register, a removable disk, and any other suitable medium for storing software and/or instructions that may be accessed and read by a computer. The storage medium 1504 may be embodied in an article of manufacture (e.g., a computer program product). By way of example, a computer program product may include a computer-readable medium in packaging materials. In view of the above, in some implementations, the storage medium 1504 may be a non-transitory (e.g., tangible) storage medium. For example, the storage medium 1504 may be a non-transitory computer-readable medium storing computer-executable code, including code to perform operations as described herein.

The storage medium 1504 may be coupled to the processing circuit 1510 such that the processing circuit 1510 can read information from, and write information to, the storage medium 1504. That is, the storage medium 1504 can be coupled to the processing circuit 1510 so that the storage medium 1504 is at least accessible by the processing circuit 1510, including examples where at least one storage medium is integral to the processing circuit 1510 and/or examples where at least one storage medium is separate from the processing circuit 1510 (e.g., resident in the apparatus 1500, external to the apparatus 1500, distributed across multiple entities, etc.).

Programming stored by the storage medium 1504, when executed by the processing circuit 1510, causes the processing circuit 1510 to perform one or more of the various functions and/or process operations described herein. For example, the storage medium 1504 may include operations configured for regulating operations at one or more hardware blocks of the processing circuit 1510, as well as to utilize the communication interface 1502 for wireless communication utilizing their respective communication protocols.

The processing circuit 1510 is generally adapted for processing, including the execution of such programming stored on the storage medium 1504. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1510 is arranged to obtain, process and/or send data, control data access and storage, issue commands, and control other desired operations. The processing circuit 1510 may include circuitry configured to implement desired programming provided by appropriate media in at least one example. For example, the processing circuit 1510 may be implemented as one or more processors, one or more controllers, and/or other structure configured to execute executable programming Examples of the processing circuit 1510 may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1510 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 1510 are for illustration and other suitable configurations within the scope of the disclosure are also contemplated.

According to one or more aspects of the disclosure, the processing circuit 1510 may be adapted to perform at least some of the features, processes, functions, operations and/or routines for any or all of the controller apparatuses described herein. For example, the processing circuit 1510 may be configured to perform any of the steps, functions, and/or controller processes described with respect to FIGS. 1-13. The term "adapted" in relation to the processing circuit 1510 may refer to the processing circuit 1510 being one or more of configured, employed, implemented, and/or programmed to perform a particular process, function, operation and/or routine according to various features described herein. The processing circuit 1510 may be a specialized processor, such as an ASIC that serves as a means for (e.g., structure for) carrying out any of the controller operations described in conjunction with FIGS. 1-13. The processing circuit 1510 serves as one example of a means for processing. In various implementations, the processing circuit 1510 may provide and/or incorporate, at least in part, the functionality described above for the controller 108 of FIG. 1.

According to at least one example of the apparatus 1500, the processing circuit 1510 may include (as shown in FIG. 15) one or more of: a circuit/module 1520 for receiving a search command identifying data or information to search for within the NVM die; a circuit/module 1522 for determining whether to search for the information using on-chip search circuitry within the NVM die or using processor(s) of the controller; a circuit/module 1524, operative in response to a determination to search using the on-chip circuitry, for controlling the NVM die to search for the information using the on-chip data search circuitry of the NVM die and receiving the search results from the NVM die; a circuit/module 1526 for controlling the NVM die to use latch-based, RAM-based, and/or register based circuitry to perform the search; and a circuit/module 1528, operative in response to a determination to search using a processor of the controller, for reading one or more blocks of data from the NVM die and searching for the information within the blocks read from the NVM array.

According to the example of the apparatus 1500, the processing circuit 1510 may further include (as shown in FIG. 16) one or more of: a circuit/module 1529 for determining a degree a fragmentation of data on the NVM die; a circuit/module 1531 for determining a structure of data on the NVM die; a circuit/module 1533 for determining a complexity of a search criteria of the search command; a circuit/module 1535 for determining a size and/or complexity of a search pattern specified in the search command; a circuit/module 1537 for determining a measure of sequentiality of data on the NVM die; a circuit/module 1539 for determining and/or setting an allowed (or permissible) number of flipped bits in matching search data; and a circuit/module 1541 for determining whether or not data stored on the NVM die is scrambled. These and other features, functions or components of the processor 1510 are discussed and described above, and hence are not described in detail in this discussion of FIGS. 15 and 16.

As mentioned above, a program stored by the storage medium 1504, when executed by the processing circuit 1510, causes the processing circuit 1510 to perform one or more of the various functions and/or process operations described herein. For example, the program may cause the processing circuit 1510 to perform and/or control the various controller functions, steps, and/or processes described herein with respect to FIGS. 1-14, including controlling operations performed by a NAND die. As shown in FIG. 15, the storage medium 1504 may include one or more of: code 1540 or receiving a search command identifying data to search for within the NVM die; code 1542 for determining whether to search for the information using on-chip search circuitry within the NVM die or using processor(s) of the controller; code 1544, operative in response to a determination to search using the on-chip circuitry, for controlling the NVM die to search for the information using the on-chip data search circuitry of the NVM die and receiving the search results from the NVM die; code 1546 for controlling the NVM die to use latch-based, RAM-based, and/or register based circuitry to perform the search; and code 1548, operative in response to a determination to search using a processor of the controller, for reading one or more blocks of data from the NVM die and searching for the information within the blocks read from the NVM array.

As further shown in FIG. 16, the storage medium 1504 may include one or more of: code 1543 for determining a degree a fragmentation of data on the NVM die; code 1545 for determining a structure of data on the NVM die; code 1547 for determining a complexity of a search criteria of the search command; code 1549 for determining a size and/or complexity of a search pattern specified in the search command; code 1551 for determining a measure of sequentiality of data on the NVM die; code 1553 for determining an allowed number of flipped bits in matching search data; and code 1555 for determining whether or not data stored on the NVM die is scrambled.

In at least some examples, means may be provided for performing the functions illustrated in FIGS. 15 and 16 and/or other functions illustrated or described herein. For example, the means may include one or more of: means, such as circuit/module 1520, for receiving a search command identifying data to search for within the NVM die; means, such as circuit/module 1522, for determining whether to search for the information using on-chip search circuitry within the NVM die or using processor(s) of the controller; means, such as, circuit/module 1524, operative in response to a determination to search using the on-chip circuitry, for controlling the NVM die to search for the information using the on-chip data search circuitry of the NVM die and receiving the search results from the NVM die; means, such as circuit/module 1526, for controlling the NVM die to use latch-based, RAM-based, and/or register based circuitry to perform the search; means, such as circuit/module 1528, operative in response to a determination to search using a processor of the controller, for reading one or more blocks of data from the NVM die and searching for the information within the blocks read from the NVM array; means, such as circuit/module 1529, for determining a degree a fragmentation of data on the NVM die; means, such as circuit/module 1531, for determining a structure of data on the NVM die; means, such as circuit/module 1533, for determining a complexity of a search criteria of the search command; means, such as circuit/module 1535, for determining a size and/or complexity of a search pattern specified in the search command; means, such as circuit/module 1537, for determining a measure of sequentiality of data on the NVM die; means, such as circuit/module 1539, for determining and/or setting an allowed (or permissible) number of flipped bits in matching search data; and means, such as circuit/module 1541, for determining whether or not data stored on the NVM die is scrambled.

Multiple-Die Systems and Apparatus

Figure 17:
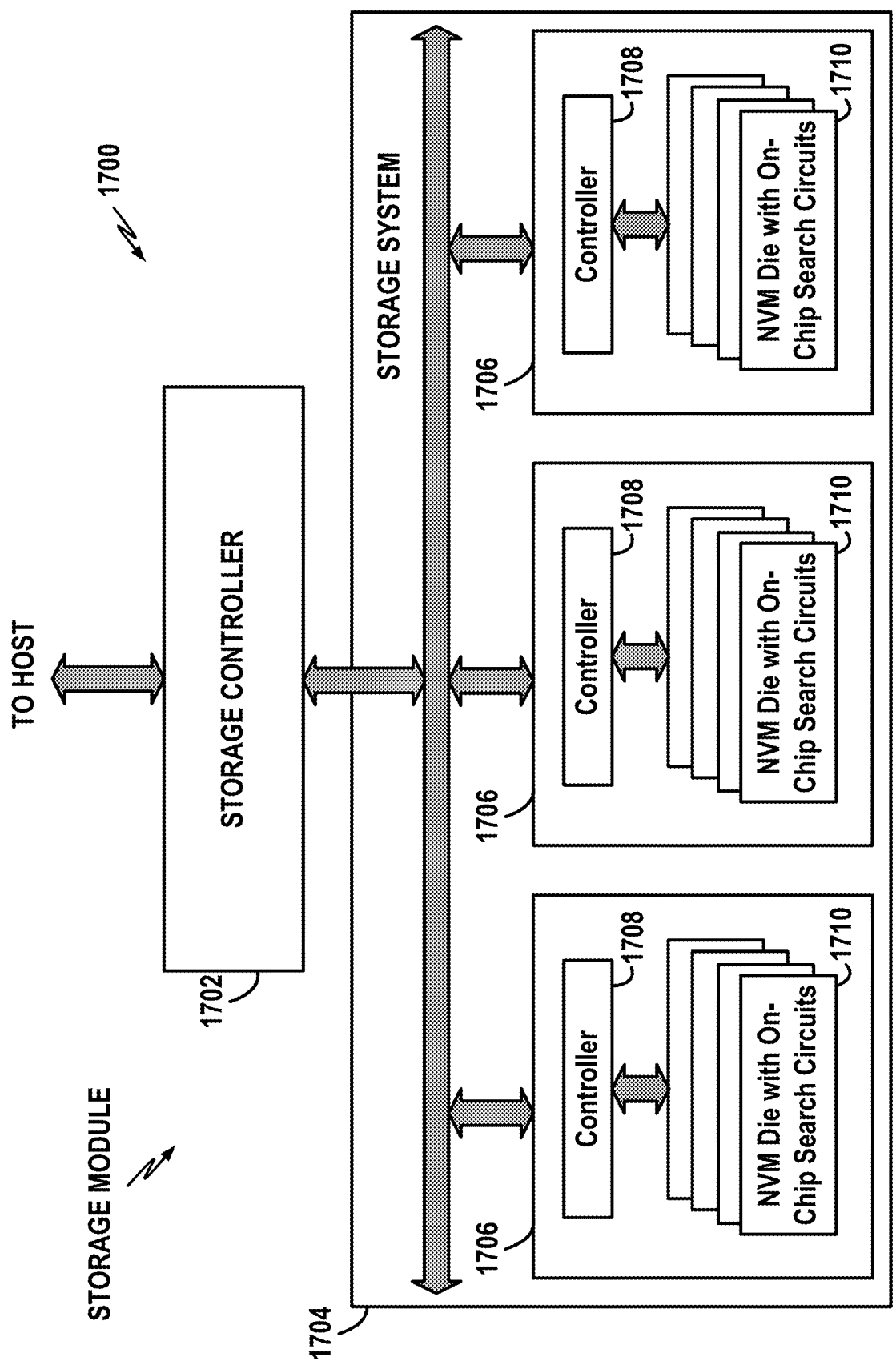
FIG. 17 is a block diagram illustrating an exemplary storage module with multiple NVM systems each having a controller and an NVM die equipped for on-chip search.

FIG. 17 is a block diagram illustrating a storage module 1700 that includes plural NVM systems 1700. Storage module 1700 includes a main storage controller 1702 that interfaces with a host and a storage system 1704, which includes a plurality of NVM systems 1706. The interface between the storage controller 1702 and the NVM systems 1100 may be a bus interface, such as a serial advanced technology attachment (SATA) or PCIe. Storage module 1700, in one embodiment, may be an SSD, such as found in portable computing devices, such as laptop computers, and tablet computers. Each NVM system 1706 includes a controller 1708 and one or more NVM dies 1710, some or all of which may be equipped with on-chip search circuits of the type described above. Each controller 1708 interfaces with a host system (via main controller 1702), such as the host device shown in FIG. 1, and transmits command sequences for read, write (program), and erase operations to one or more of the NVM dies 1710.

An individual NVM die 1710 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be SLC, MLC, TLC, or use other memory technologies, now known or later developed. Also, the memory cells can be arranged in a two-dimensional or three-dimensional fashion (as will be discussed further below). The interface between a controller 1708 and a NVM die 1710 may be any suitable flash interface, such as a suitable toggle mode. In one embodiment, memory system 1100 may be a card-based system, such as a secure digital (SD) or a micro secure digital (micro-SD) card. In an alternate embodiment, memory system 1100 may be part of an embedded memory system.

Although, in the example illustrated in FIG. 17, NVM system 1700 includes a single channel between each controller 1708 and it NVM dies 1710, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. A controller 1708 may be implemented in a single integrated circuit chip and may communicate with different layers of memory in an NVM die 1710 over one or more command channels.

The controllers 1708 and the NVM dies 1710 may be configured as described above and may operate in parallel to perform data searches in the NVM dies in parallel. These and other features allow for latency improvement and reduced power consumption of host search functions when, particularly searching within a range of LBAs, such as often occurs when searching within the folders of an operating system or within stored media files. The parallel aspects illustrated in FIG. 17 allow for increased parallelism as multiple controllers/dies are used for the search, which further reduces the latency.

Additional Aspects

Aspects of the subject matter described herein can be implemented in any suitable NAND flash memory, such as 3D NAND flash memory. Semiconductor memory devices include volatile memory devices, such as DRAM) or SRAM devices, NVM devices, such as ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration. As noted, some features described herein are specific to NAND-based devices, such as the NAND-based on-chip copy.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An apparatus, comprising:
a non-volatile memory (NVM) die; and
a processing circuit formed in the NVM die that is configured to
receive an identifier of information to search for within the NVM die, the identifier received from a data storage controller separate from the NVM die,
sense an individual wordline in the NVM die by applying a sense voltage to the individual wordline without applying sense voltages in parallel to other wordlines to be searched and while detecting read errors in the individual wordline,
search for the information within the individual wordline,
complete the search by sensing additional individual wordlines without applying sense voltages in parallel to the other wordlines to be searched and searching for the information within the additional individual wordlines, wherein the searching for the information continues in response to a determination that a value representative of the read errors does not exceed an error threshold, and
terminate the search in response to a determination that the value representative of the read errors exceeds the error threshold and send at least some of the wordlines to the data storage controller to complete the search.

2. The apparatus of claim 1, wherein the processing circuit comprises:
a plurality of latches; and
a search circuit configured to perform latch logic search operations using the plurality of latches to search for the information within the individual wordline.

3. The apparatus of claim 2,
wherein the identifier of the information comprises an input search pattern, and
wherein the search circuit is further configured to latch sensed data in a first latch of the plurality of latches and perform a logic operation on the sensed data using a second latch of the plurality of latches to compare the sensed data to the input search pattern.

4. The apparatus of claim 3, wherein the search circuit is further configured to perform the logic operation by being further configured to:
perform a Boolean AND of the sensed data in the first latch with a mask page stored in the second latch, where the mask page has a first binary value in a specified search field and a second, opposite binary value at each location elsewhere within the mask page;
store the result in a third latch of the plurality of latches;
perform a Boolean XOR of the result in the third latch with the input search pattern stored in a fourth latch of the plurality of latches to yield a resulting XOR page; and
identify a match between the sensed data and the input search pattern based on a count of a number of instances of the first binary value in the resulting XOR page.

5. The apparatus of claim 4, wherein the search circuit is further configured to identify the match between the sensed data and the input search pattern by being further configured to:
count a number of mismatched bits in the resulting XOR page;
compare the count of mismatched bits against a mismatch threshold indicative of a maximum allowable number of mismatched bits; and
detect a match between the sensed data and the input search pattern based on the count of the number of instances of the first binary value in the resulting XOR page so long as the count of mismatched bits does not exceed the mismatch threshold.

6. The apparatus of claim 5, wherein the mismatch threshold is represented as percentage of allowable mismatched bits within a total number of bits in the XOR page.

7. The apparatus of claim 1, wherein the processing circuit comprises under-the-array or next-to-the-array dedicated search circuitry configured to search for the information.

8. The apparatus of claim 7,
wherein the processing circuit includes one or more of a random access memory (RAM) or one or more registers, and
wherein the dedicated search circuitry is further configured to complete the search by being further configured to
serially scan the additional individual wordlines to store a plurality of matching wordlines in the one or more of the RAM or the registers,
perform logic processing on the plurality of matching wordlines to identify one or more fully-matched wordlines, and
output the fully-matched wordlines from the die.

9. A method for use by a non-volatile memory (NVM) die, the method comprising:
receiving a search pattern identifying information to search for within the NVM die, the search pattern received from a data storage controller that is separate from the die;
sensing an individual wordline in the NVM die by applying a sense voltage to the individual wordline without applying sense voltages in parallel to other wordlines to be searched and while detecting read errors in the individual wordline;
searching for the information within the individual wordline using the search pattern;
completing the search by sensing additional individual wordlines without applying sense voltages in parallel to the other wordlines to be searched and searching for the information within the additional individual wordlines, wherein the searching for the information continues in response to a determination that a value representative of the read errors does not exceed an error threshold; and
terminating the search in response to a determination that the value representative of the read errors exceeds the error threshold and sending at least some of the wordlines to the data storage controller to complete the search.

10. The method of claim 9, wherein searching for the information comprises:
identifying a match between the individual wordline and the search pattern while ignoring wildcard bits by setting wildcard bit values in a mask page and in the search pattern to predetermined matching values; and
applying the mask page to the individual wordline during the search for the information.

11. The method of claim 9, wherein searching for the information comprises:
identifying a match between the individual wordline and the search pattern by performing matching operations on two or more tokens.

12. The method of claim 9,
wherein the stored data in the NVM die is scrambled, and
wherein searching for the information includes de-scrambling the individual wordline using an on-chip descrambler circuit.

13. An apparatus comprising:
an input component configured to input a search command from a host identifying information to search for within data stored on a non-volatile memory (NVM) die that is separate from the apparatus; and
a processor configured to
determine, based on whether the data stored on the NVM die is scrambled, whether to search for the information using on-chip search circuitry of the NVM die or using a search component of the apparatus,
in response to a determination to search using the on-chip search circuitry of the NVM die, send a scrambling pattern to the NVM die that is a function of a storage unit index, control the NVM die to search for the information using the on-chip search circuitry of the NVM die while using the scrambling pattern that is a function of the storage unit index, and receive search results from the NVM die, and
in response to a determination to search using the search component of the apparatus, read one or more blocks of data from the NVM die and search for the information within the one or more blocks using the search component of the apparatus.

14. The apparatus of claim 13,
wherein the on-chip search circuitry of the NVM die includes (a) latch-based circuitry configured to perform latch logic search operations using one or more latches, and (b) under-the-array or next-to-the-array dedicated search circuitry configured to search for the information using random access memory (RAM) or registers formed under-the-array or next-to-the array in the die; and wherein the apparatus is further configured to determine, based on one or more of a characteristic of the search command or a structure of the stored data, whether to control the on-chip search circuitry of the NVM die to use the latch-based circuitry or to use the dedicated search circuitry to search for the information.

15. The apparatus of claim 14, wherein the one or more of the characteristic of the search command or the structure of the stored data comprises one or more of: a degree a fragmentation of data on the NVM die; a complexity of a search criteria of the search command; a size of a search pattern specified in the search command; a complexity of a search pattern specified in the search command; a measure of sequentiality of data on the NVM die; or an allowable number of flipped bits in matching search data.

16. A method for use by a data storage controller, the method comprising:
    receiving a search command from a host identifying information to search for within a non-volatile memory (NVM) die that is separate from the data storage controller;
    determining whether the information stored on the NVM die is scrambled;
    determining, based on whether the information stored on the NVM die is scrambled, whether to search for the information using on-chip search circuitry of the NVM die or using a processor of the data storage controller that processes data obtained from the NVM die;
    in response to a determination to search using the on-chip search circuitry, sending a scrambling pattern to the NVM die that is a function of a storage unit index, controlling the NVM die to search for the information using the on-chip search circuitry of the NVM die while using the scrambling pattern that is a function of the storage unit index, and receiving search results from the NVM die; and
    in response to a determination to search using the processor of the data storage controller, reading one or more blocks of data from the NVM die and searching for the information within the one or more blocks read from the NVM die using the processor.

17. The method of claim 16, wherein determining whether to search for the information using on-chip search circuitry of the NVM die or using the processor of the data storage controller is further based on one or more of: a degree a fragmentation of data to be searched; a complexity of a search criteria of the search command; a size and/or complexity of a search pattern specified in the search command; a measure of sequentiality of data on the NVM die; or an allowed number of flipped bits in matching search data.

18. The method of claim 16, wherein the on-chip search circuitry of the NVM die includes (a) latch-based search circuitry configured to perform bitwise latch logic search operations using one or more latches to search for the information; and (b) under-the-array or next-to-the-array dedicated search circuitry configured to search for the information; and wherein the method further comprises, in response to a determination to search using the on-chip search circuitry, determining whether to control the on-chip circuitry of the NVM die to use the latch-based search circuitry or to use the dedicated search circuitry to search for the information.

19. The apparatus of claim 1, wherein the processing circuit is further configured to determine the value representative of the read errors by being further configured to count a cumulative number of flipped bits in the individual wordline and the additional individual wordlines, and wherein the error threshold is indicative of a threshold number of flipped bits per a unit of NVM storage.

20. The method of claim 9,
    wherein determining the value representative of the read errors comprises counting a cumulative number of flipped bits in the individual wordline and the additional individual wordlines, and
    wherein the error threshold comprises a threshold number of flipped bits per a unit of NVM storage.

21. The apparatus of claim 13, wherein the storage unit index is one or more of a wordline index or a page index.

22. The method of claim 16, wherein the storage unit index is one or more of a wordline index or a page index.

* * * * *